(12) United States Patent
Suzuki et al.

(10) Patent No.: US 12,469,711 B2
(45) Date of Patent: Nov. 11, 2025

(54) ETCHING METHOD

(71) Applicant: ULVAC, INC., Kanagawa (JP)

(72) Inventors: Taichi Suzuki, Kanagawa (JP); Yasuhiro Morikawa, Kanagawa (JP); Kenta Doi, Kanagawa (JP); Toshiyuki Nakamura, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 18/665,377

(22) Filed: May 15, 2024

(65) Prior Publication Data

US 2024/0304453 A1 Sep. 12, 2024

Related U.S. Application Data

(63) Continuation of application No. 17/728,524, filed on Apr. 25, 2022, now Pat. No. 12,020,942.

(30) Foreign Application Priority Data

Apr. 27, 2021 (JP) ................... 2021-075098

(51) Int. Cl.
*H01L 21/3065* (2006.01)
*B81C 1/00* (2006.01)
(Continued)

(52) U.S. Cl.
CPC .... *H01L 21/30655* (2013.01); *B81C 1/00531* (2013.01); *B81C 1/00619* (2013.01);
(Continued)

(58) Field of Classification Search
None
See application file for complete search history.

(56) References Cited

U.S. PATENT DOCUMENTS

| 5,501,893 A | 3/1996 | Laermer et al. |
| 6,284,666 B1 | 9/2001 | Naeem et al. |

(Continued)

FOREIGN PATENT DOCUMENTS

| CN | 101521158 A | 9/2009 |
| CN | 105164586 A | 12/2015 |

(Continued)

OTHER PUBLICATIONS

Office Action from related Taiwanese Appln. No. 111115569, dated Jan. 11, 2023. English translation attached. 11 pages.

(Continued)

*Primary Examiner* — Jiong-Ping Lu
(74) *Attorney, Agent, or Firm* — Grossman, Tucker, Perreault & Pfleger, PLLC

(57) ABSTRACT

The present disclosure provides an etching method that includes a resist pattern-forming step of forming a resist layer on a target object, the resist layer being formed of a resin, the resist layer having a resist pattern; an etching step of etching the target object via the resist layer having the resist pattern; and a resist protective film-forming step of forming a resist protective film on the resist layer. The etching step is repetitively carried out multiple times. A processing gas, used in the resist protective film-forming step, includes a gas capable of forming $Si_xO_y\alpha_z$; wherein a is any one of F, Cl, H, and $C_kH_l$; and each of x, y, z, k, l is a selected non-zero value. After the etching steps are repetitively carried out multiple times, the resist protective film-forming step is performed.

7 Claims, 13 Drawing Sheets

(51) Int. Cl.
  *C23C 14/02* (2006.01)
  *C23C 14/34* (2006.01)
  *H01J 37/32* (2006.01)
  *H01L 21/308* (2006.01)
  *H01L 21/311* (2006.01)

(52) U.S. Cl.
  CPC ............ *C23C 14/021* (2013.01); *C23C 14/34* (2013.01); *H01J 37/321* (2013.01); *H01J 37/3244* (2013.01); *H01J 37/32541* (2013.01); *H01J 37/32568* (2013.01); *H01L 21/3065* (2013.01); *H01L 21/308* (2013.01); *H01L 21/3086* (2013.01); *H01L 21/31116* (2013.01); *H01L 21/31138* (2013.01); *H01L 21/31144* (2013.01); *B81C 2201/0112* (2013.01); *B81C 2201/0132* (2013.01); *B81C 2201/014* (2013.01); *H01J 2237/3321* (2013.01); *H01J 2237/3341* (2013.01); *H01J 2237/3342* (2013.01)

(56) References Cited

U.S. PATENT DOCUMENTS

| | | | |
|---|---|---|---|
| 2009/0221148 A1 | 9/2009 | Uda et al. | |
| 2010/0105208 A1 | 4/2010 | Winniczek et al. | |
| 2011/0244686 A1* | 10/2011 | Aso | ........... H01L 21/30655 156/345.24 |
| 2013/0181344 A1 | 7/2013 | Yanase et al. | |
| 2014/0134846 A1 | 5/2014 | Hirayama et al. | |
| 2017/0076956 A1 | 3/2017 | Hirayama et al. | |

FOREIGN PATENT DOCUMENTS

| | | |
|---|---|---|
| CN | 2017108182 A | 6/2017 |
| CN | 112384857 A | 2/2021 |
| JP | 2002033313 | 3/2002 |
| JP | 2008060566 A | 3/2008 |
| JP | 4578893 B2 | 11/2010 |
| JP | 2012507145 A | 3/2012 |
| JP | 2013084695 A | 5/2013 |
| JP | 2017108182 | 5/2016 |
| JP | 6360770 B2 | 7/2018 |
| TW | 201826375 A | 7/2018 |
| WO | 2017150628 A1 | 9/2017 |
| WO | 2017217132 A1 | 12/2017 |

OTHER PUBLICATIONS

Office Action from related Japanese Appln. No. 2021-075098, dated Mar. 22, 2023. English translation attached. 6 pages.
Office Action from related Japanese Appln. No. 2021-075098, dated Oct. 30, 2023. English translation attached. 44 pages.
Written Opinion from Japanese Appln. No. 7320554, mailed Dec. 6, 2024. English translation attached. 10 pages.
English translation of CN Search Report from the Office Action of Chinese Appln. No. 202210440462X, dated Aug. 15, 2025, 9 pages.

* cited by examiner

ETCHING METHOD

CROSS-REFERENCE TO RELATED APPLICATION

This application is a Continuation of U.S. application Ser. No. 17/728,524 filed 25 Apr. 2022, now U.S. Pat. No. 12,020,942, and claims priority from Japanese Patent Application No. 2021-075098 filed on Apr. 27, 2021, both of which are incorporated herein by reference in their entirety.

BACKGROUND OF THE INVENTION

Field of the Invention

The present invention relates to an etching method. Particularly, the invention relates to a preferred technique used for an etching method using a resist.

Description of Related Art

Conventionally, parts, for example, semiconductor parts used for an electronic device, parts used for micro mechanical parts, or the like are manufactured from a silicon substrate. In this situation, it is known that parts are formed by anisotropic chemical corrosion (attack) using plasma such as a so-called Bosch process (for example, U.S. Pat. No. 5,501,893, hereinbelow, referred to as Patent Document 1).

Furthermore, for example, Japanese Unexamined Patent Application, First Publication No. 2002-033313 (hereinbelow, referred to as Patent Document 2) discloses minimizing RIE-lag or solving a problem due to RIE-lag when such parts with a high-aspect ratio are processed.

There is a case in which a recess portion with a high-aspect ratio such as a via hole, a trench, or the like is formed on a silicon wafer by dry etching. In this case, when recess portions are formed such that patterns having aspect ratios different from each other are mixed on the same wafer, the etching rate of the pattern having a low-aspect ratio is higher than that of the pattern having a high-aspect ratio. For this reason, there is a problem in that a difference in depth, which is referred to as an RIE-lag (Reactive Ion Etch-lag), is generated.

"RIE-lag" is a phenomenon in which a difference in etching rate occurs depending on the size of the opening of a mask used in plasma etching. The difference in etching rate depends on the aspect ratio (a ratio of the depth of a groove to the width of the groove) of the groove (recess portion) such as a via hole, a trench, or the like.

In the case of carrying out an etching treatment using fluorine or oxygen, or an ashing treatment, for example, in the case of carrying out a processing for solving a problem of RIE-lag, there is a problem in that resin resist disappears.

For this reason, in the case of carrying out, for example, a dry etching treatment of silicon or the like, a selection ratio of an etching object to the resin resist is lacking, and therefore there is a problem in that a degree of accuracy of a pattern to be formed cannot be maintained.

In order to prevent such a problem from occurring, it is necessary to form a film referred to as a so-called hard mask layer on a resist layer such as resin. The hard mask layer is a protective film that is made of a metal or the like and has resistance to a fluorine-based plasma gas or an oxygen-based plasma gas.

However, it is not easy to form the same pattern as that of the resin resist layer on the hard mask layer by a photolithography process. For example, for forming the pattern on the hard mask layer, it is necessary to prepare a vacuum apparatus different from a vacuum apparatus used for carrying out etching or ashing using a fluorine-based gas or an oxygen-based gas. Furthermore, an apparatus for forming a hard mask layer made of, for example, a metal or the like on the resist layer is also necessary. Moreover, as an apparatus for a treatment different from a treatment for the resin resist layer, an apparatus is necessary for carrying out a step of a treatment such as etching or the like for forming a pattern on the hard mask layer or a cleaning treatment.

Consequently, the number of processes required for carrying out a processing, for example, forming a via, a hole, or the like on a silicon substrate increases, and a plurality of apparatuses is necessary therefor. Additionally, there is a problem in that it is necessary to transfer the silicon substrate between the plurality of the apparatuses in a state in which the silicon substrate is very likely to be contaminated.

Furthermore, even in the case of forming the hard mask layer on the resin resist layer, corrosion with respect to a side portion of the resin resist layer is generated, and there is a problem in that a degree of accuracy of the pattern of the resin resist layer becomes degraded.

Particularly, in the case of minimizing an occurrence of the problem because of RIE-lag as disclosed by Patent Document 2, since plasma processing using a fluorine-based gas or an oxygen-based gas as mentioned above is used, there is a demand for solving the problem regarding the resin resist layer.

SUMMARY OF THE INVENTION

The invention was conceived in view of the above-described circumstances and achieves the following objects.
1. To prevent a thickness of a resin-based resist layer from being reduced or prevent the resist layer from being removed in a plasma processing using a fluorine-based gas or an oxygen-based gas.
2. To maintain a degree of accuracy of a pattern to be formed in the case of etching treatment with respect to silicon or in the case of processing a conductor, an insulator, or the like.
3. To prevent a resist pattern from being consumed and to maintain a degree of accuracy of the pattern formed on the resist layer in a multistep silicon etching processing such as a so-called Bosch process.
4. To prevent a resist pattern from being consumed and to maintain a degree of accuracy of the pattern formed on the resist layer even in a process of forming a micro pattern on the other conductor or the other insulator.

An etching method according to an aspect of the invention, includes: a resist pattern-forming step of forming a resist layer on a target object, the resist layer being formed of a resin, the resist layer having a resist pattern; an etching step of etching the target object via the resist layer having the resist pattern; and a resist protective film-forming step of forming a resist protective film on the resist layer. The etching step is repetitively carried out multiple times. After the etching steps are repetitively carried out multiple times, the resist protective film-forming step is carried out. Accordingly, the above-mentioned problem is solved.

In the etching method according to the aspect of the invention, the resist protective film-forming step may use a plasma film formation method.

In the etching method according to the aspect of the invention, a processing gas used in the resist protective film-forming step may contain a gas capable of forming $Si_xO_y\alpha_z$.

In the etching method according to the aspect of the invention, the resist protective film-forming step may not be carried out until an etching state of the target object obtained by the etching step becomes a predetermined state.

In the etching method according to the aspect of the invention, the resist protective film-forming step may be carried out after a predetermined aspect ratio of the target object is obtained by the etching step.

In the etching method according to the aspect of the invention, the target object may be made of silicon.

The etching method according to the aspect of the invention may further include a deposition step to be carried out before the etching step; and an ashing step to be carried out after the etching step. In the deposition step, a deposition layer may be formed on the target object using a first gas in accordance with the resist pattern. In the etching step, a dry etching treatment may be carried out with respect to the target object using a second gas in accordance with the resist pattern. In the ashing step, a third gas may be used. In the deposition step, the first gas may contain fluorocarbon. In the etching step, the second gas may contain sulfur fluoride and silicon fluoride. In the ashing step, the third gas may contain oxygen gas. In the ashing step, an anisotropic plasma processing may be carried out, and the anisotropic plasma processing may have anisotropy in a direction in which a recess pattern is formed on a surface of the target object. In the anisotropic plasma processing, inductively-coupled plasma may be generated by applying an alternating voltage to an electrode disposed so as to face the target object. A frequency of the alternating voltage applied to a position of the electrode corresponding to a center region of the surface of the target object may be different from a frequency of the alternating voltage applied to a position of the electrode corresponding to an outer-periphery region of the surface of the target object.

The etching method according to the aspect of the invention may prepare a plasma-processing apparatus. The plasma-processing apparatus may include: a chamber including an upper lid, the upper lid having a center region and an outer-periphery region, the outer-periphery region being located outside the center region, the chamber being configured to carry out plasma processing with respect to the target object in an internal space capable of reducing a pressure thereof; a first electrode disposed in the chamber, the target object being mounted on the first electrode; a first power source configured to apply a bias voltage having a first frequency $\lambda 1$ to the first electrode; a spiral shaped second electrode disposed outside the chamber, the second electrode being located at an opposite side of the first electrode with respect to the upper lid, the second electrode being disposed on the center region; a spiral shaped third electrode disposed outside the chamber, the third electrode being located at an opposite side of the first electrode with respect to the upper lid, the third electrode being disposed at the outer-periphery region outside the second electrode; a second power source configured to apply an alternating voltage having a second frequency $\lambda 2$ to the second electrode; a third power source configured to apply an alternating voltage having a third frequency $\lambda 3$ to the third electrode; a gas introduction device configured to introduce a processing gas containing fluorine into an inside of the chamber; and a solid source located between the upper lid and the first electrode in the chamber, the solid source being disposed closer to the upper lid than the first electrode, the solid source being used in sputtering. When the anisotropic plasma processing is carried out, when the second frequency $\lambda 2$ and the third frequency $\lambda 3$ are in relationship of $\lambda 2 > \lambda 3$, the gas introduction device may be disposed at the center region of the upper lid.

The etching method according to the aspect of the invention, includes: a resist pattern-forming step of forming a resist layer on a target object, the resist layer being formed of a resin, the resist layer having a resist pattern; an etching step of etching the target object via the resist layer having the resist pattern; and a resist protective film-forming step of forming a resist protective film on the resist layer. The etching step is repetitively carried out multiple times, and after the etching steps are repetitively carried out multiple times, the resist protective film-forming step is carried out.

Consequently, by forming the resist protective film, it is possible to limit or prevent a thickness of the resist layer having the resist pattern from being reduced or it is possible to limit or prevent the resist layer from being removed in the etching step. Accordingly, it is possible to maintain a degree of accuracy of etching treatment with respect to the target object. Therefore, it is possible to reduce the film thickness of the resist layer forming the resist pattern. Thus, the target object can be subjected to a treatment at a low load.

Furthermore, by reducing the film thickness of the resist layer, it is possible to improve a degree of accuracy of the pattern. By reducing the film thickness of the resist layer, the etching method according to an aspect of the invention is also applicable to a photolithography processing using exposure light having a short wavelength (exposure processing). At the same time, since it is possible to improve resistance of the resist with respect to plasma or the like, it is possible to carry out a plasma processing even in the case of using the kinds of resist which cannot be used in a conventional plasma processing and have vulnerable characteristics with respect to a plasma processing.

In the etching method according to the aspect of the invention, the resist protective film-forming step uses a plasma film formation method.

The plasma film formation method is, for example, a plasma CVD method (plasma chemical vapor deposition method). Consequently, it is possible to form the resist protective film by the plasma CVD method. Accordingly, it is possible to form the resist protective film in the same chamber as a chamber of a plasma apparatus carrying out the etching step.

In the etching method according to the aspect of the invention, a processing gas used in the resist protective film-forming step contains a gas capable of forming $Si_xO_y\alpha_z$.

Consequently, it is possible to form the resist protective film made of silicon fluoride oxide SiOF on the resist pattern, and it is possible to limit or prevent a thickness of the resist layer having the resist pattern from being reduced or it is possible to limit or prevent the resist layer from being removed in the etching step.

Additionally, by forming the resist protective film made of silicon fluoride oxide SiOF, it is possible to obtain a protective effect without mostly affecting the resist pattern.

Here, as long as the processing gas used in the resist protective film-forming step is a gas or a mixed gas which is capable of forming $Si_xO_y\alpha_z$, the kinds of the processing gas are not limited. For example, as a gas capable of forming $Si_xO_y\alpha_z$, a mixed gas of oxygen gas and a gas including at least one of $SiF_4$ gas, $SiCl_4$ gas, $SiH_4$ gas, TEOS (tetra ethoxysilane, tetra ethyl ortho silicate, $Si(OC_2H_5)_4$) gas, or the like may be adopted.

In the etching method according to the aspect of the invention, the resist protective film-forming step is not carried out until an etching state of the target object obtained by the etching step becomes a predetermined state.

In the etching step, an etching treatment, for example, a treatment of deep etching to a silicon substrate or the like may be repetitively carried out predetermined times. In a cyclic process such as such that the etching treatment is carried out multiple times as mentioned above, when a damage such as a reduction in the thickness of the resist layer having the resist pattern or the like does not comparatively occur such as a case of immediately after an etching treatment begun, it is possible that the resist protective film is not formed. Accordingly, in a processing state in which, for example, an etching processing is not proceeding and a processing depth (etching depth) is small, the resist protective film is not formed on a bottom surface to be processed by etching. That is, it is possible to prevent a progress degree of etching treatment from decreasing because of formation of the resist protective film on the bottom surface. In addition, for example, when the processing depth becomes large due to progress of the etching processing, the resist protective film is not formed on the bottom surface to be processed. Therefore, the etching treatment can be carried out in the state in which a progress degree of the etching treatment does not decrease.

In the etching method according to the aspect of the invention, the resist protective film-forming step is carried out after a predetermined aspect ratio of the target object is obtained by the etching step.

In the etching step, an etching treatment, for example, a treatment of deep etching to a silicon substrate or the like may be repetitively carried out predetermined times. In a cyclic process such as such that the etching treatment is carried out multiple times as mentioned above, immediately after an etching treatment begun, when an aspect ratio of the etched portion is not comparatively high and a damage such as a reduction in the thickness of the resist layer having the resist pattern or the like does not comparatively occur, it is possible that the resist protective film is not formed. Accordingly, in a processing state in which, for example, an etching processing is not proceeding and an aspect ratio is small, the resist protective film is not formed on a bottom surface to be processed by etching. That is, it is possible to prevent a progress degree of etching treatment from decreasing because of formation of the resist protective film on the bottom surface. In addition, for example, when the aspect ratio becomes large due to progress of the etching processing, the resist protective film is not formed on the bottom surface to be processed. Therefore, the etching treatment can be carried out in the state in which a progress degree of the etching treatment does not decrease.

In the etching method according to the aspect of the invention, the target object is made of silicon.

Consequently, it is possible to improve processing accuracy in semiconductor manufacturing using the silicon substrate, device manufacturing such as a MEMS, or the like, it is possible to reduce the number of processes, and it is possible to reduce the cost of processing therefor.

The etching method according to the aspect of the invention, further includes: a deposition step to be carried out before the etching step; and an ashing step to be carried out after the etching step. In the deposition step, a deposition layer is formed on the target object using a first gas in accordance with the resist pattern. In the etching step, a dry etching treatment is carried out with respect to the target object using a second gas in accordance with the resist pattern. In the ashing step, a third gas is used. In the deposition step, the first gas contains fluorocarbon. In the etching step, the second gas contains sulfur fluoride and silicon fluoride. In the ashing step, the third gas contains oxygen gas. In the ashing step, an anisotropic plasma processing is carried out, and the anisotropic plasma processing has anisotropy in a direction in which a recess pattern is formed on a surface of the target object. In the anisotropic plasma processing, inductively-coupled plasma is generated by applying an alternating voltage to an electrode disposed so as to face the target object. A frequency of the alternating voltage applied to a position of the electrode corresponding to a center region of the surface of the target object is different from a frequency of the alternating voltage applied to a position of the electrode corresponding to an outer-periphery region of the surface of the target object.

Consequently, in the state in which the deposition layer adhered to the region close to the inner-periphery of the opening of the resist pattern is removed by the ashing step, it is possible to form the recess pattern on the surface of the silicon target object by a dry-etching step. Accordingly, a tapered shape such that the width of the etched recess pattern becomes narrower with an increase in the etching depth of the recess pattern due to the deposition layer adhered to the region close to the inner-periphery of the opening of the resist pattern can be prevented from being generated.

Moreover, there is a case in which thicknesses of the deposition layer formed on the bottom portions of the recess patterns vary depending on the diameters of the opening patterns. Specifically, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller. Even in the case of simultaneously forming the opening patterns having diameters different from each other described above, the depths of the recess patterns become equal to each other, and it is possible to prevent the RIE-lag from being generated. Furthermore, even in the case of using a resist layer having a thin resist pattern, the etching treatment can be carried out without a reduction in the thickness of the resist layer without the resist layer being removed.

That is, the aforementioned silicon dry etching method utilizes the etching stop effect due to the deposition layer formed by the deposition step. Because of this, it is possible to reduce a difference between the depths of the recess patterns after the recess patterns (a hole, a trench, or the like) having sizes (diameters) different from each other are formed on the silicon substrate.

The etching method according to the aspect of the invention prepares a plasma-processing apparatus. The plasma-processing apparatus includes: a chamber including an upper lid, the upper lid having a center region and an outer-periphery region, the outer-periphery region being located outside the center region, the chamber being configured to carry out plasma processing with respect to the target object in an internal space capable of reducing a pressure thereof; a first electrode disposed in the chamber, the target object being mounted on the first electrode; a first power source configured to apply a bias voltage having a first frequency $\lambda 1$ to the first electrode; a spiral shaped second electrode disposed outside the chamber, the second electrode being located at an opposite side of the first electrode with respect to the upper lid, the second electrode being disposed on the center region; a spiral shaped third electrode disposed outside the chamber, the third electrode being located at an opposite side of the first electrode with respect to the upper lid, the third electrode being disposed at the outer-periphery region outside the second electrode; a second power source configured to apply an alternating voltage having a second frequency $\lambda 2$ to the second electrode; a third power source configured to apply an alternating voltage having a third frequency $\lambda 3$ to the third electrode; a gas introduction device configured to introduce a processing gas containing fluorine into an inside of the chamber; and a solid source located between the upper lid and the first electrode in the chamber, the solid source being disposed closer to the upper lid than the first electrode, the solid source being used in sputtering. When the anisotropic plasma processing is carried out, when the second frequency $\lambda 2$ and the third frequency $\lambda 3$ are in relationship of $\lambda 2 > \lambda 3$, the gas introduction device is disposed at the center region of the upper lid.

With this configuration, the solid source is disposed between the upper lid and the first electrode in the chamber. The solid source is used in sputtering. Consequently, for example, an oxygen element that becomes insufficient in plasma is sequentially introduced into the plasma from the solid source. For this reason, the oxygen element is uniformly supplied to the silicon substrate serving as a target object in the radial direction of the substrate.

Accordingly, as described above, inductively-coupled plasma with high anisotropy in the direction in which the recess pattern is formed on the surface of the silicon substrate is generated, and it is possible to carry out the anisotropic plasma processing. Therefore, the shape of the side wall of the recess pattern formed on the silicon substrate is maintained to be a substantially straight shape in the depth direction of the recess pattern. Thus, the shape of the recess pattern (a hole, a trench, or the like) obtained by the etching is a vertical shape (straight shape), and the recess pattern having the vertical shape can be stably formed on the outer-periphery region of the silicon substrate as well as the center region of the silicon substrate, that is, without depending on the position in the radial direction of the silicon substrate in the direction along the surface of the silicon substrate.

As a result, it is possible to form recess patterns on the entire processing surface of the silicon substrate such that the shapes of the recess patterns obtained by the etching are vertical to the surface of the substrate without depending on the substrate size or the substrate shape. The recess pattern having the above-mentioned shape can be formed on the silicon substrate by use of the resist layer having a thin resist pattern at a low load. In the above-described steps of forming the recess pattern, a thickness of the resist layer having the resist pattern does not decrease, the resist layer is not removed, and the etching treatment can be carried out.

Effects of the Invention

According to the invention, in a plasma processing using a fluorine-based gas or an oxygen-based gas, it is possible to prevent a thickness of a resin-based resist layer having the resist pattern from being reduced or it is possible to prevent the resist layer from being removed. Furthermore, an effect is obtained such that it is possible to improve processing accuracy using a further thin resist pattern at a low load.

DETAILED DESCRIPTION OF THE INVENTION

Hereinafter, an etching method according to a first embodiment of the invention will be described with reference to the drawings.

Figure 1:
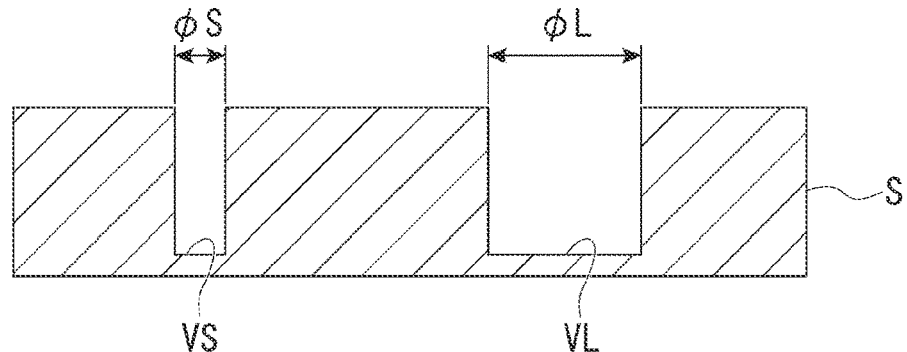
FIG. 1 is a schematic cross-sectional view showing a silicon substrate serving as a target object manufactured by an etching method according to a first embodiment of the invention.
Figure 2:
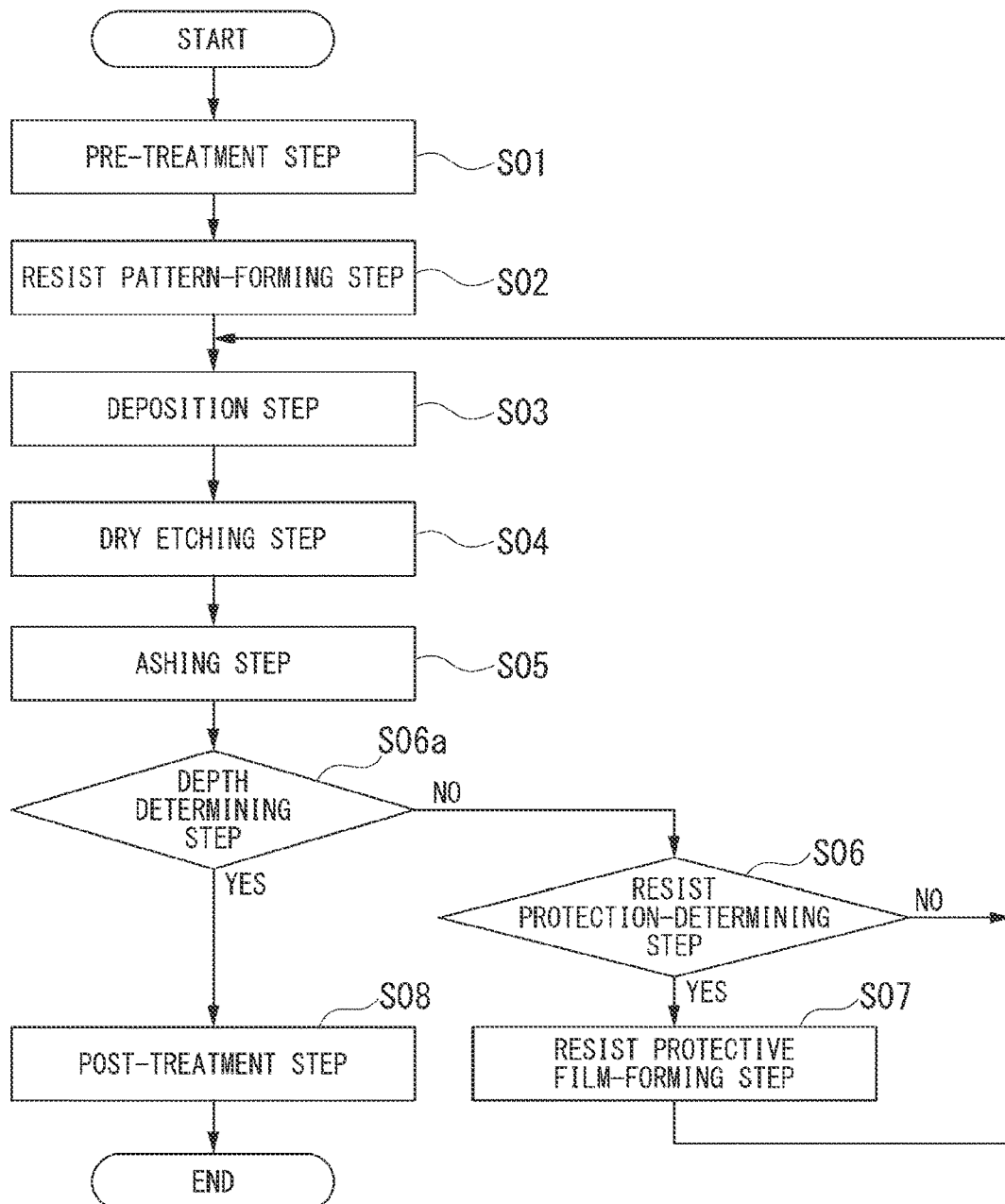
FIG. 2 is a flowchart showing the etching method according to the first embodiment of the invention.

FIG. 1 is a schematic cross-sectional view showing a silicon substrate manufactured by an etching method according to the embodiment. FIG. 2 is a flowchart showing the etching method according to the embodiment. In FIG. 1, reference letter S is a silicon substrate. The silicon substrate is an example of a target object.

The etching method according to the embodiment is a dry etching method of carrying out etching using the silicon substrate S as the target object while protecting a resist made of a resin or the like. Note that, as long as etching can be carried out while protecting the resist, the invention is not limited to the embodiment described below.

As shown in FIG. 1, a recess pattern VS and a recess pattern VL are formed on a surface of a silicon substrate S by the silicon dry etching method according to the embodiment.

The recess pattern VS has a diameter (size) of φS. The recess pattern VL has a diameter (size) of φL. The diameter φL is set larger than the diameter φS.

The depth of the recess pattern VS is the same as the depth of the recess pattern VL.

Each of the recess pattern VS and the recess pattern VL is formed in a shape with a high-aspect ratio, for example, in a range of approximately 4 to 8, more preferably in a range of approximately 8 to 14.

Note that the recess pattern VS and the recess pattern VL may penetrate through the silicon substrate S.

As shown in FIG. 2, the silicon dry etching method according to the embodiment includes a pre-treatment step S01, a resist pattern-forming step S02, a deposition step S03, a dry-etching step S04, an ashing step S05, a depth-determining step S06a, a resist protection-determining step S06, a resist protective film-forming step S07, and a post-treatment step S08.

In the pre-treatment step S01 shown in FIG. 2, the silicon substrate S is subjected to pretreatment by, for example, heat-treatment of 200° C. or more using a known lamp heater or the like.

Figure 3:
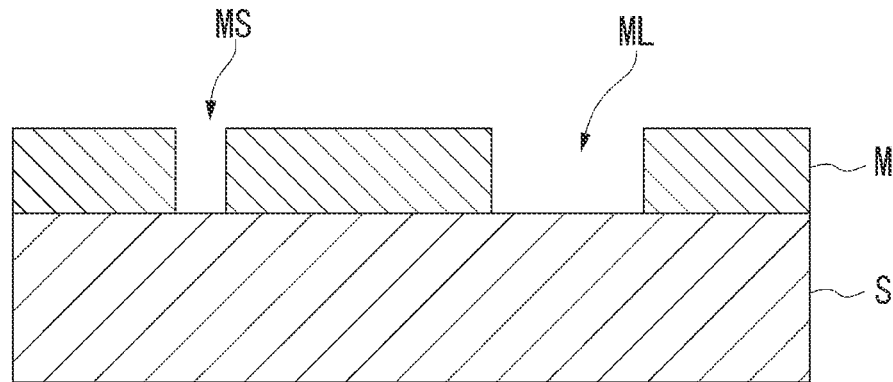
FIG. 3 is a cross-sectional view showing a step of the etching method according to the first embodiment of the invention.

FIG. 3 is a cross-sectional view showing a step of the silicon dry etching method according to the embodiment.

In the resist pattern-forming step S02 shown in FIG. 2, a resist layer M having a pattern is formed on the surface of the silicon substrate S as shown in FIG. 3. The resist layer M is an example of a mask layer.

The resist layer M can be formed of a known resin resist. The resist layer M can be formed so as to have a predetermined thickness by appropriately selecting a positive resist, a negative resist, an exposure wavelength, or the like, or by selecting conditions such as deposition methods or the like. As a material used to form the resist layer M, for example, a photosensitive insulating material or other known materials may be used.

Moreover, in the resist pattern-forming step S02, as shown in FIG. 3, an opening pattern MS and an opening pattern ML are formed on the resist layer M. The opening pattern MS is an opening pattern that sets a processing region so as to correspond to a shape of the recess pattern VS on the silicon substrate S. The opening pattern ML is an opening pattern that sets a processing region so as to correspond to a shape of the recess pattern VL on the silicon substrate S. Each of the opening pattern MS and the opening pattern ML is an example of a mask pattern.

Specifically, in the resist pattern-forming step S02, the resist layer M serving as a photoresist is formed on the silicon substrate S, and a treatment such as exposure, development, or the like is carried out. Furthermore, the resist layer M is subjected to a known treatment such as a wet etching treatment, a dry etching treatment, or the like. Accordingly, the resist layer M having the opening pattern MS and the opening pattern ML is formed on the silicon substrate S.

Figure 4:
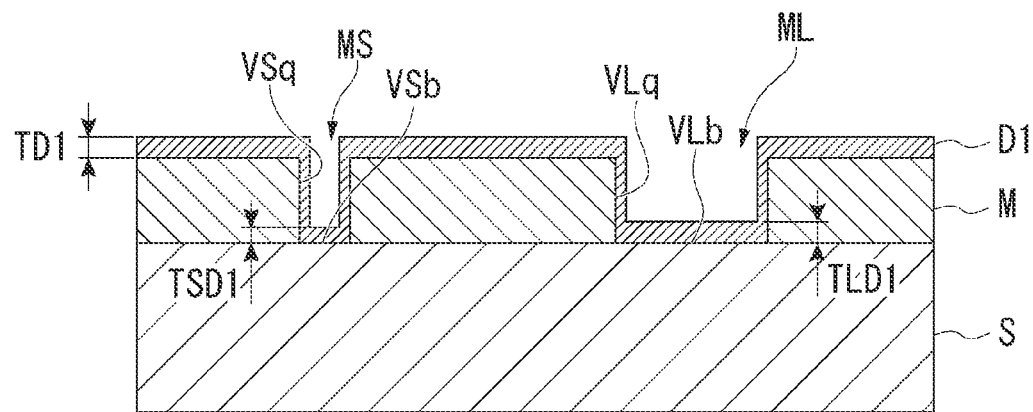
FIG. 4 is a cross-sectional view showing a step of the etching method according to the first embodiment of the invention.

FIG. 4 is a cross-sectional view showing a step of the silicon dry etching method according to the embodiment.

In the deposition step S03 shown in FIG. 2, a deposition layer D1 made of a polymer such as fluorocarbon or the like is formed on the entire surface of the silicon substrate S by anisotropic plasma processing as shown in FIG. 4. The deposition layer D1 protects side walls of the recess pattern VS and the recess pattern VL from being etched by the dry-etching step S04.

The deposition layer D1 is formed in order to protect the side walls VSq and VLq of the recess patterns VS and VL from being etched, respectively, and in order to limitedly carry out etching with respect to the bottom portions VSb and VLb of the recess patterns VS and VL, respectively. Consequently, the vertical side walls VSq and VLq are obtained in the dry-etching step S04, which is etching using a fluorine compound.

The deposition layer D1 is formed on the surface of the resist layer M and the bottom portions VSb and VLb of the recess patterns VS and VL. Although the deposition layer D1 coated on the side walls VSq and VLq of the recess patterns VS and VL, respectively, is shown in FIG. 4, practically, the deposition layer D1 is almost not formed on the side walls VSq and VLq.

In the deposition step S03, a plasma processing is carried out using a fluorocarbon gas such as $CHF_3$, $C_2F_6$, $C_2F_4$, $C_4F_8$, or the like. Here, a plasma-processing apparatus 10 described below is used.

In this situation, in the plasma-processing apparatus 10, the frequency $\lambda 2$ (high-frequency) of power applied to a second electrode E2 (inside electrode) located at the inner-periphery side thereof described below can be set higher than the frequency $\lambda 3$ (high-frequency) of power applied to a third electrode E3 (outside electrode) located at the outer-periphery side thereof. Specifically, for example, the frequency $\lambda 2$ may be 13.65 MHz, and the frequency $\lambda 3$ may be 2 MHz. In the deposition step S03, the maximum value of the power supplied to the electrodes positioned at the inner-periphery region and the outer-periphery region is the value of the power which the power source can output. Consequently, it is possible to improve the ashing rate.

Additionally, in the plasma-processing apparatus 10, the value of the power with the frequency $\lambda 2$ applied to the second electrode E2 located at the inner-periphery side described below can be set lower than the values of the power of the dry-etching step S04 and the ashing step S05 described later. Furthermore, in the plasma-processing apparatus 10, a bias voltage may not be applied to a first electrode 12.

In the atmosphere in which the deposition step S03 is carried out, a predetermined pressure is set, and a deposition process is carried out. Moreover, in the deposition step S03, for example, a noble gas such as Ar or the like may be added to a gas used in deposition processing at a predetermined amount.

Regarding the film thickness of the deposition layer D1 formed by the deposition step S03, the film thickness of the deposition layer D1 formed on the bottom portion VLb corresponding to the opening pattern ML having a large diameter becomes larger than the film thickness of the deposition layer D1 formed on the bottom portion VSb corresponding to the opening pattern MS having a small diameter. Note that, the film thickness of the deposition layer D1 formed on the bottom portion VLb of the opening pattern ML becomes equal to or smaller than the film thickness of the deposition layer D1 formed on the surface of the resist layer M located outside the opening patterns MS and ML.

That is, regarding the film thickness of the deposition layer D1, the film thicknesses gradually become smaller in the order of the film thickness TD1 of the deposition layer D1 formed on the surface of the resist layer M positioned outside the opening patterns MS and ML, the film thickness TLD1 of the deposition layer D1 formed on the bottom portion VLb of the opening pattern ML, and the film thickness TSD1 of the deposition layer D1 formed on the bottom portion VSb of the opening pattern MS.

In the deposition step S03, the deposition coverage of the deposition layer D1 of the bottom portions VSb and VLb corresponding to the opening patterns MS and ML, respectively, can be controlled so as to obtain optimized deposition coverage by setting deposition conditions as described above. Here, the preferred conditions for forming the deposition coverage are those that shorten a processing time required for causing the deposition layer D1 having a necessary film thickness to be formed on the bottom portions VSb and VLb. That is, the preferred conditions for forming the deposition coverage are those that increase the film-formation rate at which the deposition layer D1 is formed on the bottom portions VSb and VLb.

Additionally, the preferred conditions for forming the deposition coverage are those that control the deposition coverage depending on the etching depth and the aspect ratio. That is, as described below, even in the case in which the aspect ratios are changed depending on variation in the depths of the bottom portions VSb and VLb, it is possible to form the deposition layer D1 having a desired thickness at a predetermined film-formation rate.

Furthermore, the preferred conditions for forming the deposition coverage are those that improve uniformity and reliability with respect to the deposition layer D1 formed on the bottom portion VSb and improve uniformity and reliability with respect to the deposition layer D1 formed on the bottom portion VLb.

Figure 5:
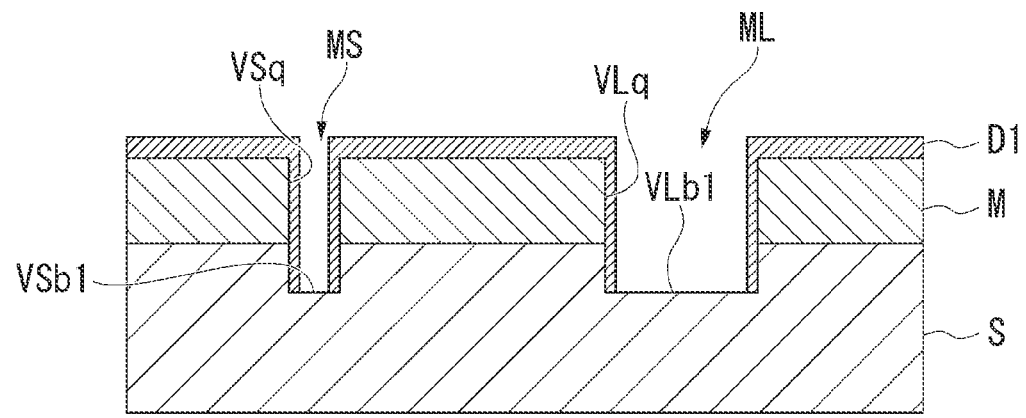
FIG. 5 is a cross-sectional view showing a step of the etching method according to the first embodiment of the invention.

FIG. 5 is a cross-sectional view showing a step of the silicon dry etching method according to the embodiment.

In the dry-etching step S04 shown in FIG. 2, the bottom portions VSb and VLb corresponding to the opening patterns MS and ML are etched by anisotropic plasma etching as shown in FIG. 5, the positions of the bottom portions VSb and VLb are lowered, and thereby the bottom portions VSb1 and VLb1 are formed.

In this situation, the depths of the bottom portion VSb1 corresponding to the opening pattern MS and the bottom portion VLb1 corresponding to the opening pattern ML formed by the dry-etching step S04 are uniform by the processing conditions of the dry-etching step S04 and the plasma anisotropy thereof and the difference between the film thickness of the deposition layers D1 formed by the deposition step S03.

Particularly, the film thickness TSD1 of the deposition layer D1 formed on the bottom portion VSb corresponding to the opening pattern MS is smaller than the film thickness TLD1 of the deposition layer D1 formed on the bottom portion VLb corresponding to the opening pattern ML. Moreover, the etching amount with respect to the bottom portion VSb corresponding to the opening pattern MS is smaller than the etching amount with respect to the bottom portion VLb corresponding to the opening pattern ML. Therefore, the film thickness of the deposition layer formed by the aforementioned deposition and the etching amount of the aforementioned etching are balanced, and the depth of the bottom portion VSb1 corresponding to the opening pattern MS and the depth of the bottom portion VLb1 corresponding to the opening pattern ML are uniform.

Additionally, an effect of the etching with respect to the side walls VSq and VLq corresponding to the opening patterns MS and ML, respectively, is extremely reduced by the processing conditions of the dry-etching step S04 and the plasma anisotropy thereof and by the deposition layer D1. For this reason, the side walls VSq and VLq are vertical to the surface of the silicon substrate S. Each of the side walls VSq and VLq substantially has a plane. Accordingly, the side walls VSq and VLq without irregularities are formed so as to extend in the depth direction.

That is, as the recess patterns VS and VL, the bottom portions VSb1 and VLb1 are formed so as to have a uniform diameter.

The plasma-processing apparatus 10 described later is used to generate plasma with high anisotropy in the dry-etching step S04 so as to achieve this shape.

In this situation, in the plasma-processing apparatus 10, the frequency $\lambda 2$ of the power applied to the second electrode E2 located at the inner-periphery side thereof described below can be set higher than the frequency $\lambda 3$ of the power applied to the third electrode E3 located at the outer-periphery side thereof. Specifically, for example, the frequency $\lambda 2$ may be 13.65 MHz, and the frequency $\lambda 3$ may be 2 MHz.

Moreover, in the plasma-processing apparatus 10, the value of the power with the frequency $\lambda 2$ applied to the second electrode E2 located at the inner-periphery side described below can be higher than the value of the power of the deposition step S03 and can be set to be the same as the value of the power of the ashing step S05.

Additionally, in the plasma-processing apparatus 10, the value of the power with the frequency $\lambda 2$ applied to the second electrode E2 located at the inner-periphery side described below can be set to be the same as the value of the power with the frequency $\lambda 3$ applied to the third electrode E3 located at the outer-periphery.

Moreover, in the plasma-processing apparatus 10, it is preferable to apply a bias voltage with the frequency $\lambda 1$ to the first electrode 12. The frequency $\lambda 1$ can be set lower than the frequency $\lambda 3$ of the power applied to the third electrode E3 located at the outer-periphery. The frequency $\lambda 1$ may be, for example, 400 kHz.

Furthermore, in the anisotropic plasma etching of the dry-etching step S04, a mixed gas of $SF_6$ and $O_2$ is decomposed by plasma, and anisotropic etching with respect to Si is carried out. For this reason, Si is etched by the F-radical generated due to decomposition of $SF_6$ ($F+Si \rightarrow SiF_4$). This etching reaction occurs in isotropic etching. In order to carry out anisotropic etching, the etching reaction with respect to the side walls VSq and VLq may be suppressed by forming an insulating layer (protective film) that adheres to the side walls VSq and VLq.

In the anisotropic plasma etching using the mixed gas of $SF_6/O_2$ in the dry-etching step S04, the deposition layer D1 is removed from the side walls VSq and VLq corresponding to the opening patterns MS and ML, respectively, and the side walls VSq and VLq are exposed.

Here, in the anisotropic plasma etching using the mixed gas of $SF_6/O_2$ in the dry-etching step S04, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, in the dry-etching step S04, $SiF_4$ can be used as an etching gas in order to prevent lack of the etching product of $SiF_4$.

Moreover, in the dry-etching step S04, $SF_6$ or $NF_3$ is used as an etching gas, $SiF_4$ serving as a silicon compound is added to the etching gas, and $O_2$, $N_2$, $N_2O$, NO, $NO_x$, or $CO_2$, which serves as a reactant, is added to the gas. Accordingly, the bottom portions VSb and VLb can be intensively etched.

Furthermore, in the dry-etching step S04, a substrate temperature during processing is lowered by using the first electrode 12 that includes a cooling medium pathway thereinside and is provided with an electrostatic chuck, and therefore it is possible to increase a degree of anisotropy. For example, the temperature of a cooling medium flowing to the cooling medium pathway is set to be lower than or equal to 10° C.

Figure 6:
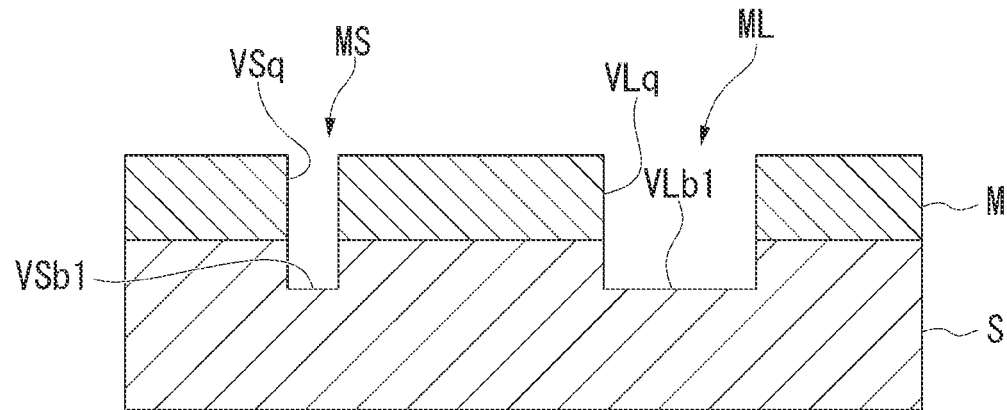
FIG. 6 is a cross-sectional view showing a step of the etching method according to the first embodiment of the invention.

FIG. 6 is a cross-sectional view showing a step of the silicon dry etching method according to the embodiment.

In the ashing step S05 shown in FIG. 2, the remaining deposition layer D1 is removed after the dry-etching step S04 is completed as shown in FIG. 6.

Particularly, in the ashing step S05, ashing conditions are set so as to reliably remove the deposition layer D1 that remains on the region close to the inner-peripheries of the opening pattern MS and the opening pattern ML of the resist layer M.

In the ashing step S05, after the dry-etching step S04 is completed, the deposition layer D1 adhered to the surface of the resist layer M, the deposition layer D1 that remains on the region close to the inner-peripheries of the opening pattern MS and the opening pattern ML of the resist layer M, and the deposition layers D1 that remain on the side walls VSq and VLq corresponding to the opening patterns MS and ML, respectively, are removed. Furthermore, in the case in which the deposition layer D1 remains on the bottom portion VSb1 corresponding to the opening pattern MS and the deposition layer D1 remains on the bottom portion VLb1 corresponding to the opening pattern ML, the remaining deposition layers are removed.

In the ashing step S05, the deposition layer D1 that remains on the inner-periphery positions of the opening pattern MS and the deposition layer D1 that remains on the inner-periphery positions of the opening pattern ML are not completely removed and thereby may still remain. This case is not preferable. Particularly, in cycles (first cycle, second cycle cyclic, or the like) of repetitively carrying out a plurality of steps including the deposition step S03, the dry-etching step S04, and the ashing step S05, a deposition layer D2 may be further deposited on the remaining deposition layer D1 by carrying out the deposition step S03 of the second cycle in the cycle of repetitively carrying out the deposition step S03, the dry-etching step S04, and the ashing step S05. In this case, the opening diameters (opening space) of the opening pattern MS and the opening pattern ML of the resist layer M decrease.

As described above, in the case in which the opening diameters of the opening pattern MS and the opening pattern ML of the resist layer M decrease, even where the etching with a high degree of anisotropy is carried out in the dry-etching step S04 of the second cycle carried out next to the ashing step S05 of the first cycle, the deposition layer D1 and the deposition layer D2 inhibit the etching plasma from reaching the bottom portion VSb1 and the bottom portion VLb1. Accordingly, there is a possibility that the etching with respect to the bottom portion VSb1 and the bottom portion VLb1 is not carried out. For this reason, the side walls VSq and VLq corresponding to the opening patterns MS and ML, respectively, are not vertical, and therefore there is possibility that the shapes of the recess patterns VS and VL each become a tapered shape.

In contrast, in the state in which the deposition layer D1 does not remain at the inner-periphery position of the opening pattern MS and the deposition layer D1 does not remain at the inner-periphery position of the opening pattern ML, the deposition layer D2 is not further deposited on the remaining deposition layer D1 in the deposition step S03 of the second cycle carried out next to the first cycle. For this reason, the shapes of the openings of the opening pattern MS and the opening pattern ML can be maintained such that each of the opening diameters of the opening pattern MS and the opening pattern ML of the resist layer M has a predetermined size.

Thereafter, in the dry-etching step S04 of the second cycle, as a result of carrying out the etching with a high degree of anisotropy, reach of the etching plasma to the bottom portion VSb1 and the bottom portion VLb1 is not inhibited by the deposition layer D1 and the deposition layer D2. Consequently, the etching with respect to the bottom portion VSb1 and the bottom portion VLb1 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape, and it is possible to form each of the recess patterns VS and VL having a uniform diameter in the depth direction with a high-aspect ratio.

In the ashing step S05 of the first cycle, as described above, it is necessary to carry out the plasma processing with a high degree of ionization to the $O_2$ gas used in order to reliably remove the deposition layer D1 that remains on the inner-periphery positions of the opening patterns MS and ML. Therefore, also in the ashing step S05 of the first cycle, the plasma-processing apparatus 10 described later is used.

In this situation, in the plasma-processing apparatus 10 used in the ashing step S05 of the first cycle, the frequency $\lambda 2$ of the power applied to a second electrode E2 located at the inner-periphery side thereof described below can be set higher than the frequency $\lambda 3$ of the power applied to a third electrode E3 located at the outer-periphery side thereof. Specifically, for example, the frequency $\lambda 2$ may be 13.65 MHz, and the frequency $\lambda 3$ may be 2 MHz.

Moreover, in the plasma-processing apparatus 10 used in the ashing step S05 of the first cycle, the value of the power with the frequency $\lambda 2$ applied to the second electrode E2 located at the inner-periphery side described below can be higher than the value of the power of the deposition step S03 and can be set to be the same as or higher than the value of the power of the dry-etching step S04.

Additionally, in the plasma-processing apparatus 10 used in the ashing step S05 of the first cycle, the value of the power with the frequency $\lambda 2$ applied to the second electrode E2 located at the inner-periphery side described below can be set to be the same as the value of the power with the frequency $\lambda 3$ applied to the third electrode E3 located at the outer-periphery.

Moreover, in the plasma-processing apparatus 10 used in the ashing step S05 of the first cycle, it is preferable to apply a bias voltage with the frequency $\lambda 1$ to the first electrode 12. The frequency $\lambda 1$ can be set lower than the frequency $\lambda 3$ of the power applied to the third electrode E3 located at the outer-periphery. The power of the bias voltage of the ashing step S05 of the first cycle can be set to be equal to the power of the bias voltage of the dry-etching step S04 of the first cycle or higher than the power of the bias voltage of the dry-etching step S04 of the first cycle.

In the ashing step S05 of the first cycle, it is possible to carry out the ashing by supply of $O_2$ gas. According to the anisotropic plasma processing using the $O_2$ gas, the deposition layer D1 is reliably removed and the side walls VSq and VLq are exposed at the portions close to the inner-peripheries of the opening patterns MS and ML, and the side walls VSq and VLq corresponding to the opening patterns MS and ML, respectively. At the same time, the ashing is carried out by supply of $O_2$ gas in the ashing step S05 of the first cycle. In this step, the resist layer M made of a resin is slightly removed, and therefore the film thickness of the resist layer M may decrease.

As shown in FIG. 2, the silicon dry etching method according to the embodiment carries out the deposition step S03, the dry-etching step S04, the ashing step S05, the depth-determining step S06a, and the resist protection-determining step S06.

In other words, the deposition step S03, the dry-etching step S04, the ashing step S05, the depth-determining step S06a, and the resist protection-determining step S06 form one cycle (one process cycle). This cycle may be referred to as "repetitive cycle". Additionally, this cycle may be referred to as "substrate-processing cycle". In the embodiment, this cycle is repeated multiple times at a predetermined frequency. In other words, the dry-etching step S04 is repetitively carried out multiple times. Since one cycle includes the etching step, the cycle may be referred to as etching cycle.

After this cycle is completed, the resist protective film-forming step S07 may be carried out in accordance with the determination result of the depth-determining step S06a. In other words, after the dry-etching step S04 is repetitively carried out multiple times, the resist protective film-forming step S07 may be carried out.

Consequently, in the silicon dry etching method according to the embodiment, not only it is possible to cause the depths of the recess patterns VS and VL to be larger by the steps S03, S04, and S05, but also it is possible to carry out the determination of the depths of the recess patterns VS and VL and the determination as to whether or not a resist protective film is necessary.

In the depth-determining step S06a, it is determined whether to proceed to the subsequent resist protection-determining step S06. At this time, regarding the determination standard of the depth-determining step S06a, determination in accordance with the depths of the recess patterns VS and VL is carried out. In other words, the determination in accordance with the aspect ratio of the recess patterns VS and VL is carried out.

When it is determined that the depths of the recess patterns VS and VL are not sufficient in the depth-determining step S06a (determination result: NO), it is determined that the etching step of the subsequent cycle is necessary, and the step proceeds to the resist protection-determining step S06. In the resist protection-determining step S06, it is determined whether to proceed to the resist protective film-forming step S07 described below.

On the other hand, when it is determined that the depths of the recess patterns VS and VL are sufficient in the depth-determining step S06a (determination result: YES), the etching is completed, and the step proceeds to the post-treatment step S08.

In the resist protection-determining step S06, it is determined whether the subsequent cycle including the subsequent etching step is carried out without carrying out the resist protective film-forming step S07 or whether the step proceeds to the resist protective film-forming step S07 described below.

Here, regarding the determination standard of the resist protection-determining step S06, the determination in accordance with the depths of the recess patterns VS and VL is carried out.

When it is determined that the depths of the recess patterns VS and VL are not sufficient (determination result: NO), the step proceeds to the deposition step S03 for the first step of the subsequent cycle.

The reason that the subsequent cycle is carried out without carrying out the resist protective film-forming step S07 is as follows.

When the depths of the recess patterns VS and VL are not sufficient, when a resist protective film Mm is formed by proceeding to the resist protective film-forming step S07 described below, it is conceivable that a defect occurs. Specifically, in the resist protective film-forming step S07, the resist protective film Mm is formed not only on the top surface of the resist layer M but also on the bottom portions VSb and VLb of the opening patterns MS and ML. When the resist protective film Mm is formed on the bottom portions VSb and VLb of the opening patterns MS and ML, there is a possibility that an undesirable effect of etching affects to the silicon substrate S such that etching does not progress or the like on the bottom portions VSb and VLb.

Regarding the determination standard of the resist protection-determining step S06, the determination in accordance with the depths of the recess patterns VS and VL is carried out. In other words, the determination in accordance with the aspect ratio of the recess patterns VS and VL is carried out. Particularly, when the aspect ratio of the recess patterns VS and VL is, for example, in a range of approximately 1 to 2 (determination result: NO), the cycle including the subsequent etching step is carried out.

When the aspect ratio of the recess patterns VS and VL is, for example, in a range of approximately 3 to 4 (determination result: YES), the step proceeds to the resist protective film-forming step S07 described below. That is, determination of the resist protection-determining step S06 is carried out in accordance with the opening spaces of the recess patterns VS and VL and the etching amounts of the bottom portions VSb and VLb by the etching step of the first cycle.

In other cases, the determination of the resist protection-determining step S06 may be based on the measurement result obtained by measuring the depths of the recess patterns VS and VL of the silicon substrate S after the first cycle is carried out. Additionally, in the determination of the resist protection-determining step S06, an estimation of the etching conditions of the first cycle is carried out, and it may be determined whether to proceed to the second cycle. The determination based on the etching conditions may be based on the setting corresponding to the etching depth obtained by a predetermined condition in advance.

Next, the case of carrying out the second cycle without carrying out the resist protective film-forming step S07 will be described.

Figure 7:
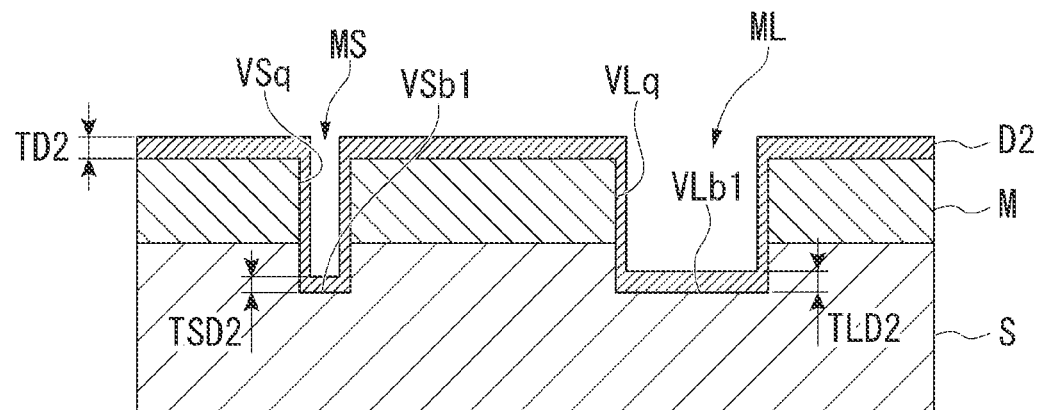
FIG. 7 is a cross-sectional view showing a step of the etching method according to the first embodiment of the invention.

FIG. 7 is a cross-sectional view showing a step of the silicon dry etching method according to the embodiment.

The deposition step S03 of the second cycle shown in FIG. 2 is carried out after the determination based on the depth-determining step S06a and the resist protection-determining step S06 is carried out. In the deposition step S03 of the second cycle, a deposition layer D2 made of a polymer such as fluorocarbon or the like is formed on the entire surface of the silicon substrate S by anisotropic plasma processing as shown in FIG. 7. It is possible to protect the side walls of the recess pattern VS and the recess pattern VL from being etched by the dry-etching step S04 to be carried out after the deposition step S03 of the second cycle.

The deposition layer D2 is formed in order to protect the side walls VSq and VLq of the recess patterns VS and VL from being etched, respectively, and in order to limitedly carry out etching with respect to the bottom portions VSb1 and VLb1 of the recess patterns VS and VL, respectively. Therefore, in the dry-etching step S04 to be carried out after the deposition step S03 of the second cycle, vertical side walls VSq and VLq are obtained by carrying out etching using a fluorine compound.

The deposition layer D2 is formed on the surface of the resist layer M and the bottom portions VSb1 and VLb1 of the recess patterns VS and VL. Although the deposition layer D2 coated on the side walls VSq and VLq of the recess patterns VS and VL, respectively, is shown in FIG. 7, practically, the deposition layer D2 is almost not formed on the side walls VSq and VLq.

The deposition step S03 of the second cycle is the same as the deposition step S03 of the first cycle. That is, an anisotropic plasma processing is carried out using a fluorocarbon gas. In the deposition step S03, the plasma-processing apparatus 10 described below is used in a similar way to the case of the deposition step S03 of the first cycle.

The conditions used in the deposition step S03 of the second cycle using the plasma-processing apparatus 10, for example, the frequency $\lambda 2$ of the power applied to the second electrode E2, the frequency $\lambda 3$ of the power applied to the third electrode E3, the ambient pressure, or the like, can be set to the same as those of the deposition step S03 of the first cycle. Here, processing conditions of the deposition step S03 to be carried out after the second cycle may be the same as or different from those of the deposition step S03 of the first cycle.

Note that, the processing conditions of the deposition step S03 of the second cycle may be the processing conditions equal to those of the deposition step S03 of the first cycle. The processing conditions may be adopted in consideration of a reduction in deposition rate with respect to the bottom portions VSb1 and VLb1 of the recess patterns VS and VL.

For example, the power applied to the second electrode E2 located at the inner-periphery side may increase, the power applied to the third electrode E3 located at the outer-periphery side may increase, and the power applied to the electrodes E2 and E3 may increase. A condition of applying a bias voltage to the first electrode 12 in order to attract deposition particles to the silicon substrate S may be adopted.

The film thickness of the deposition layer D2 formed by the deposition step S03 of the second cycle is the same as that of the deposition step S03 of the first cycle. That is, the film thickness of the deposition layer D2 formed on the bottom portion VLb1 corresponding to the opening pattern ML having the large diameter becomes larger than the film thickness of the deposition layer D2 formed on the bottom portion VSb1 corresponding to the opening pattern MS having the small diameter. Note that, the film thickness of the deposition layer D2 formed on the bottom portion VLb1 of the opening pattern ML becomes equal to or smaller than the film thickness of the deposition layer D2 formed on the surface of the resist layer M located outside the opening patterns MS and ML.

That is, regarding the film thickness of the deposition layer D2, the film thicknesses gradually become smaller in the order of the film thickness TD2 of the deposition layer D2 formed on the surface of the resist layer M positioned outside the opening patterns MS and ML, the film thickness TLD2 of the deposition layer D2 formed on the bottom portion VLb1 of the opening pattern ML, and the film thickness TSD2 of the deposition layer D2 formed on the bottom portion VSb1 of the opening pattern MS.

In the deposition step S03 of the second cycle, the deposition coverage of the deposition layer D2 of the bottom portions VSb1 and VLb1 corresponding to the opening patterns MS and ML, respectively, is controlled so as to obtain optimized deposition coverage by setting deposition conditions as described above. Here, the preferred conditions for forming the deposition coverage are those that shorten a processing time required for causing the deposition layer D2 having a necessary film thickness to be formed on the bottom portions VSb1 and VLb1. That is, the preferred conditions for forming the deposition coverage are those that increase the film-formation rate at which the deposition layer D2 is formed on the bottom portions VSb1 and VLb1.

In the deposition step S03 of the second cycle, the preferred conditions for forming the deposition coverage are those that control the deposition coverage in accordance with the etching depth and the aspect ratio. That is, as described below, the depths of the bottom portions VSb and VLb are different from the depths of the bottom portions VSb1 and VLb1, and therefore the depths of the bottom portions are changed. Even in the case in which the aspect ratio is changed depending on variation in the depths of the bottom portions as described above, it is possible to form the deposition layer D2 having a desired thickness at a predetermined film-formation rate.

Furthermore, the preferred conditions for forming the deposition coverage are those that improve uniformity and reliability with respect to the deposition layer D2 formed on the bottom portion VSb1 and improve uniformity and reliability with respect to the deposition layer D2 formed on the bottom portion VLb1.

Additionally, the processing time of the deposition step S03 of the second cycle can be longer than the processing time of the deposition step S03 of the first cycle. Particularly, the above-described setting of the processing time is the same as that of the deposition step S03 to be carried out after the third cycle.

Figure 8:
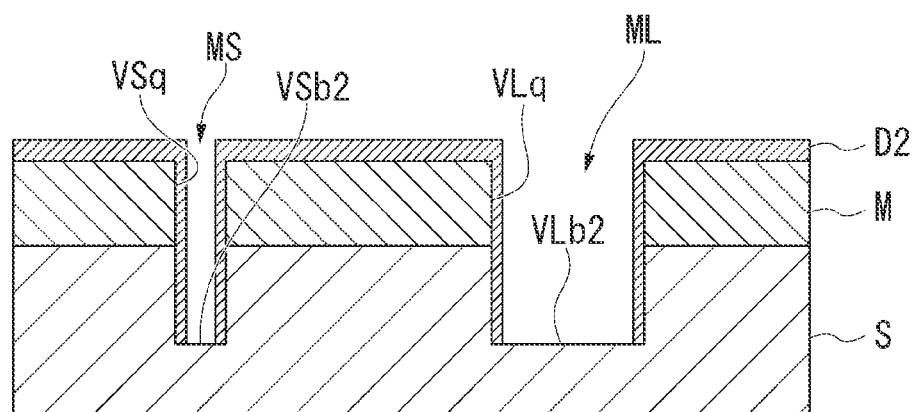
FIG. 8 is a cross-sectional view showing a step of the etching method according to the first embodiment of the invention.

FIG. 8 is a cross-sectional view showing a step of the silicon dry etching method according to the embodiment.

In the dry-etching step S04 of the second cycle shown in FIG. 2, the bottom portions VSb1 and VLb1 corresponding to the opening patterns MS and ML are etched by anisotropic plasma etching as shown in FIG. 8, the positions of the bottom portions VSb1 and VLb1 are lowered, and thereby the bottom portions VSb2 and VLb2 are formed.

In this situation, the depths of the bottom portion VSb2 corresponding to the opening pattern MS and the bottom portion VLb2 corresponding to the opening pattern ML formed by the dry-etching step S04 of the second cycle are set to be uniform by the processing conditions of the dry-etching step S04 of the second cycle and the plasma anisotropy thereof and the difference between the film thickness of the deposition layers D2 formed by the deposition step S03.

Particularly, the film thickness TSD2 of the deposition layer D2 formed on the bottom portion VSb1 corresponding to the opening pattern MS is smaller than the film thickness TLD2 of the deposition layer D2 formed on the bottom portion VLb1 corresponding to the opening pattern ML. Moreover, the etching amount with respect to the bottom portion VSb1 corresponding to the opening pattern MS is smaller than the etching amount with respect to the bottom portion VLb1 corresponding to the opening pattern ML. Therefore, the film thickness of the deposition layer formed by the aforementioned deposition and the etching amount of the aforementioned etching are balanced, and the depth of the bottom portion VSb2 corresponding to the opening pattern MS and the depth of the bottom portion VLb2 corresponding to the opening pattern ML are uniform.

Additionally, an effect of the etching with respect to the side walls VSq and VLq corresponding to the opening patterns MS and ML, respectively, is extremely reduced by the processing conditions of the dry-etching step S04 of the second cycle and the plasma anisotropy thereof and by the deposition layer D2. For this reason, the side walls VSq and VLq are vertical to the surface of the silicon substrate S. Each of the side walls VSq and VLq substantially has a plane. Accordingly, the side walls VSq and VLq without irregularities are formed so as to extend in the depth direction.

That is, as the recess patterns VS and VL, the bottom portions VSb2 and VLb2 are formed so as to have a uniform diameter.

Also in the dry-etching step S04 of the second cycle, the plasma processing with high anisotropy is carried out so as to achieve this shape. In the dry-etching step S04 of the second cycle, the plasma-processing apparatus 10 described below is used.

In this situation, the processing conditions of the plasma-processing apparatus 10 used in the dry-etching step S04 of the second cycle can be the same conditions as those of the dry-etching step S04 of the first cycle.

Moreover, the setting conditions of the plasma-processing apparatus 10 used in the dry-etching step S04 of the second cycle are also the same as those of the dry-etching step S04 of the first cycle. Particularly, the value of the power with the frequency $\lambda2$ applied to the second electrode E2 located at the inner-periphery side described below can be higher than the value of the power of the deposition step S03 of the second cycle and can be set to be the same as the value of the power of the ashing step S05 of the second cycle.

Moreover, the setting conditions of the plasma-processing apparatus 10 used in the dry-etching step S04 of the second cycle are also the same as those of the dry-etching step S04 of the first cycle. Particularly, the value of the power with the frequency $\lambda2$ applied to the second electrode E2 located at the inner-periphery side described below can be set to be the same as the value of the power with the frequency $\lambda3$ applied to the third electrode E3 located at the outer-periphery side.

Moreover, the setting conditions of the plasma-processing apparatus 10 used in the dry-etching step S04 of the second cycle are also the same as those of the dry-etching step S04 of the first cycle. It is preferable to apply a bias voltage with the frequency $\lambda1$ to the first electrode 12. The frequency $\lambda1$ can be set lower than the frequency $\lambda3$ of the power applied to the third electrode E3 located at the outer-periphery. The frequency $\lambda1$ may be, for example, 400 kHz.

Furthermore, the anisotropic plasma etching of the dry-etching step S04 of the second cycle is the same as that of the first cycle. That is, the mixed gas of $SF_6$ and $O_2$ is decomposed by plasma, and anisotropic etching with respect to Si is carried out. For this reason, Si is etched by the F-radical generated due to decomposition of $SF_6$ (F+Si→$SiF_4$). This etching reaction occurs in isotropic etching. In order to carry out anisotropic etching, the etching reaction with respect to the side walls VSq and VLq may be suppressed by forming a protective film that adheres to the side walls VSq and VLq.

The anisotropic plasma etching using the mixed gas of $SF_6/O_2$ in the dry-etching step S04 of the second cycle is the same as the dry-etching step S04 of the first cycle. That is, the deposition layer D2 is removed from the side walls VSq and VLq corresponding to the opening patterns MS and ML, respectively, and the side walls VSq and VLq are exposed.

Here, the anisotropic plasma etching using the mixed gas of $SF_6/O_2$ in the dry-etching step S04 of the second cycle is the same as the dry-etching step S04 of the first cycle. That is, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, in the dry-etching step S04 of the second cycle, $SiF_4$ can be used as an etching gas in order to prevent lack of the etching product of $SiF_4$ in a similar way to the case of the dry-etching step S04 of the first cycle.

Moreover, the dry-etching step S04 of the second cycle is the same as the dry-etching step S04 of the first cycle. That is, $SF_6$ or $NF_3$ is used as an etching gas, $SiF_4$ serving as a silicon compound is added to the etching gas, and $O_2$, $N_2$, $N_2O$, NO, $NO_x$, or $CO_2$ which serves as a reactant is added to the gas. Accordingly, the bottom portions VSb1 and VLb1 can be intensively etched.

Additionally, the processing time of the dry-etching step S04 of the second cycle can also be longer than the processing time of the dry-etching step S04 of the first cycle. Particularly, the above-described setting of the processing time is the same as that of the dry-etching step S04 to be carried out after the third cycle.

Figure 9:
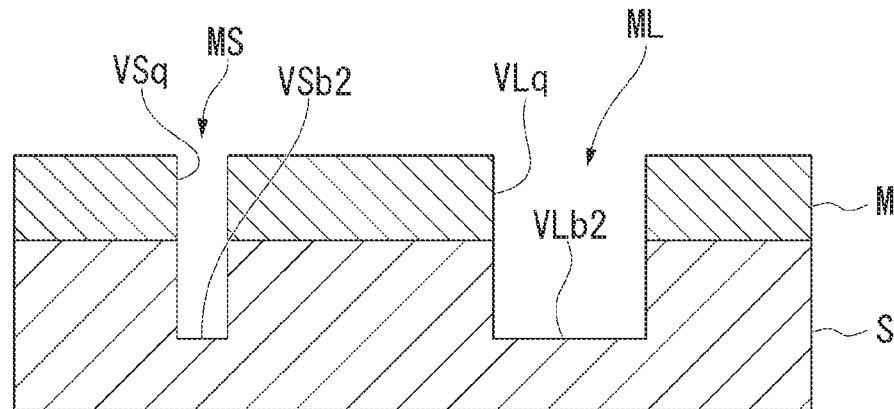
FIG. 9 is a cross-sectional view showing a step of the etching method according to the first embodiment of the invention.

FIG. 9 is a cross-sectional view showing a step of the silicon dry etching method according to the embodiment.

In the ashing step S05 of the second cycle shown in FIG. 2, the remaining deposition layer D2 is removed after the dry-etching step S04 of the second cycle is completed as shown in FIG. 9.

Particularly, in the ashing step S05 of the second cycle, the ashing conditions are set so as to reliably remove the deposition layer D2 that remains on the region close to the inner-peripheries of the opening pattern MS and the opening pattern ML of the resist layer M.

The ashing step S05 of the second cycle is the same as the ashing step S05 of the first cycle. After the dry-etching step S04 of the second cycle is completed, the deposition layer D2 adhered to the surface of the resist layer M, the deposition layer D2 that remains on the region close to the inner-peripheries of the opening pattern MS and the opening pattern ML of the resist layer M, and the deposition layers D2 that remain on the side walls VSq and VLq corresponding to the opening patterns MS and ML, respectively, are removed.

Furthermore, in the case in which the deposition layer D2 remains on the bottom portion VSb2 corresponding to the opening pattern MS and the deposition layer D2 remains on the bottom portion VLb2 corresponding to the opening pattern ML, the deposition layer D2 is removed.

Here, it is most important to remove the deposition layer D2 that remains at the inner-periphery position of the opening pattern MS and the deposition layer D2 that remains at the inner-periphery position of the opening pattern ML. When the deposition layer D2 remains without being removed, a deposition layer D3 is further deposited on the remaining deposition layer D2 by carrying out the deposition step S03 of the next cycle in the repetitive cycles. In this case, the opening diameters of the opening pattern MS and the opening pattern ML of the resist layer M decrease.

As described above, in the case in which the opening diameters of the opening pattern MS and the opening pattern ML of the resist layer M decrease, even where the etching with a high degree of anisotropy is carried out in the dry-etching step S04 of the third cycle carried out next to the second cycle, the deposition layer D2 and the deposition layer D3 inhibit the etching plasma from reaching the bottom portion VSb2 and the bottom portion VLb2. Accordingly, the etching with respect to the bottom portion VSb2 and the bottom portion VLb2 is preferably not carried out, the side walls VSq and VLq corresponding to the opening patterns MS and ML, respectively, are not vertical, and therefore there is possibility that the shapes of the recess patterns VS and VL each become a tapered shape.

In contrast, in the state in which the deposition layer D2 does not remain at the inner-periphery position of the opening pattern MS and the deposition layer D2 does not remain at the inner-periphery position of the opening pattern ML, the deposition layer D3 is not further deposited on the remaining deposition layer D2 in the deposition step S03 of the third cycle carried out next to the second cycle of the repetitive cycles. For this reason, the opening diameters of the opening pattern MS and the opening pattern ML of the resist layer M can be maintained so as to have a predetermined size.

Therefore, in the dry-etching step S04 of the third cycle of the repetitive cycles, as a result of carrying out the etching with a high degree of anisotropy, reach of the etching plasma to the bottom portion VSb2 and the bottom portion VLb2 is not inhibited by the deposition layer D2 and the deposition layer D3. Consequently, the etching with respect to the bottom portion VSb2 and the bottom portion VLb2 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape, and it is possible to form each of the recess patterns VS and VL with a high-aspect ratio so as to have a uniform diameter in the depth direction.

In the ashing step S05 of the second cycle, the deposition layer D2 that remains at the inner-periphery positions of the opening patterns MS and ML is reliably removed as described above. For this purpose, in a similar way to the case of the ashing step S05 of the first cycle described above, it is necessary to generate plasma with high anisotropy. Therefore, also in the ashing step S05 of the second cycle, the plasma-processing apparatus 10 described later is used.

In this situation, the processing conditions of the plasma-processing apparatus 10 used in the ashing step S05 of the second cycle are the same as those of the ashing step S05 of the first cycle. That is, the frequency $\lambda 2$ of the power applied to the second electrode E2 located at the inner-periphery side described below can be set higher than the frequency $\lambda 3$ of the power applied to the third electrode E3 located at the outer-periphery side. Specifically, for example, the frequency $\lambda 2$ may be 13.65 MHz, and the frequency $\lambda 3$ may be 2 MHz.

Moreover, the setting conditions of the plasma-processing apparatus 10 used in the ashing step S05 of the second cycle are the same as those of the first cycle. Particularly, the value of the power with the frequency $\lambda 2$ applied to the second electrode E2 located at the inner-periphery side described below can be higher than the value of the power of the deposition step S03 and can be set to be the same as the value of the power of the dry-etching step S04 of the second cycle.

Moreover, the processing conditions of the plasma-processing apparatus 10 used in the ashing step S05 of the second cycle are the same as those of the ashing step S05 of the first cycle. As described below, the value of the power with the frequency $\lambda 2$ applied to the second electrode E2 located at the inner-periphery side can be set to be the same as the value of the power with the frequency $\lambda 3$ applied to the third electrode E3 located at the outer-periphery.

Furthermore, the processing conditions of the plasma-processing apparatus 10 used in the ashing step S05 of the second cycle are the same as those of the ashing step S05 of the first cycle. Particularly, it is preferable to apply a bias voltage with the frequency $\lambda 1$ to the first electrode 12. The frequency $\lambda 1$ can be set lower than the frequency $\lambda 3$ of the power applied to the third electrode E3 located at the outer-periphery. The frequency $\lambda 1$ may be, for example, 400 kHz.

Furthermore, the processing conditions of the plasma-processing apparatus 10 used in the ashing step S05 of the second cycle are the same as those of the ashing step S05 of the first cycle. Particularly, it is preferable to apply the bias voltage to the first electrode 12. The power of the bias voltage of the ashing step S05 of the second cycle can be set to be equal to the power of the bias voltage of the dry-etching step S04 of the second cycle or higher than the power of the bias voltage of the dry-etching step S04 of the second cycle.

In the ashing step S05 of the second cycle, it is possible to carry out the ashing by supply of $O_2$ gas. According to the anisotropic plasma processing using the $O_2$ gas, the deposition layer D2 is reliably removed and the side walls VSq and VLq are exposed at the portions close to the inner-peripheries of the opening patterns MS and ML, and the side walls VSq and VLq corresponding to the opening patterns MS and ML, respectively. At the same time, it is possible to carry out the ashing by supply of $O_2$ gas in the ashing step S05 of the second cycle. Because of this, the resist layer M made of a resin is slightly removed, and therefore the film thickness of the resist layer M may decrease in this step.

When the ashing step S05 of the second cycle is completed, the depth-determining step S06a is carried out in a similar way to the case of the first cycle. In accordance with the determination result of the depth-determining step S06a, it is determined whether to carry out the post-treatment step S08 or the resist protection-determining step S06 of the second cycle. In accordance with the determination result of the resist protection-determining step S06, it is determined that the subsequent cycle including the etching step is carried out or the resist protective film-forming step S07 described below is carried out.

In the depth-determining step S06a of the second cycle, it is determined whether to proceed to the subsequent resist protection-determining step S06. At this time, regarding the determination standard of the depth-determining step S06a, determination in accordance with the depths of the recess patterns VS and VL is carried out. In other words, the determination in accordance with the aspect ratio of the recess patterns VS and VL is carried out.

When the depths of the recess patterns VS and VL are not sufficient (determination result: NO), it is determined that the etching step of the subsequent cycle is necessary, and the step proceeds to the resist protection-determining step S06. In the resist protection-determining step S06, it is determined whether to proceed to the resist protective film-forming step S07 described below.

On the other hand, when the depths of the recess patterns VS and VL are sufficient in the depth-determining step S06a (determination result: YES), the etching is completed, and the step proceeds to the post-treatment step S08.

In the resist protection-determining step S06 of the second cycle, regarding the determination standard, the determination in accordance with the depths of the recess patterns VS and VL is carried out in a similar way to the case of the resist protection-determining step S06 of the first cycle. In other words, the determination in accordance with the aspect ratio of the recess patterns VS and VL is carried out.

In the resist protection-determining step S06 of the second cycle, when it is determined that the depths of the recess patterns VS and VL are not sufficient (determination result: NO), the step proceeds to the deposition step S03 for the first step of the subsequent cycle in a similar way to the case of the resist protection-determining step S06 of the first cycle.

On the other hand, when the depths of the recess patterns VS and VL are sufficient (determination result: YES) and the aspect ratio of the recess patterns VS and VL is greater than the aforementioned range, a determination of forming the resist protective film Mm in the resist protective film-forming step S07 is carried out.

That is, determination of the resist protection-determining step S06 is carried out in accordance with the opening spaces of the recess patterns VS and VL and the etching amounts of the bottom portions VSb1 and VLb1 by the etching step of the second cycle.

In other cases, the determination of the resist protection-determining step S06 may be based on the measurement result obtained by measuring the depths of the recess patterns VS and VL of the silicon substrate S after the second cycle. The determination may be based on an estimation of the etching conditions of the second cycle, and therefore it may be determined whether to proceed to the third cycle. The determination based on the etching conditions may be based on the setting corresponding to the etching depth obtained by a predetermined condition in advance.

Furthermore, in the resist protection-determining step S06 of the second cycle, the determination is carried out based on the following determination standard.

For example, when the amount of thickness loss of the resist layer M obtained by the ashing step S05 is smaller than a predetermined value, it is determined that the cycle including the subsequent etching step is carried out without carrying out the resist protective film-forming step S07.

On the other hand, regarding the determination standard of the resist protection-determining step S06 of the second cycle, when the amount of thickness loss of the resist layer M obtained by the ashing step S05 is larger than a predetermined value, it is determined that the resist protective film-forming step S07 is carried out.

The reason for carrying out the above-described determination is that, when the step proceeds to the etching step of the third cycle in the state in which the amount of thickness loss of the resist layer M is larger than a predetermined value, there is a possibility that the film thickness of the resist layer M becomes insufficient, and it is not possible to maintain a degree of accuracy of the shape formed by the etching processing.

Next, the case of proceeding with the resist protective film-forming step S07 will be described.

As shown in FIG. 2, the resist protective film-forming step S07 is carried out before proceeding to the third cycle.

Figure 10:
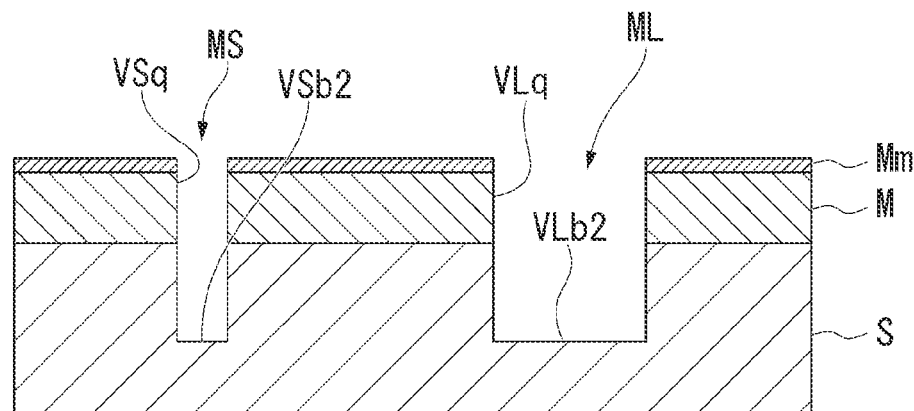
FIG. 10 is a cross-sectional view showing a step of the etching method according to the first embodiment of the invention.

FIG. 10 is a cross-sectional view showing a step of the silicon dry etching method according to the embodiment.

In the resist protective film-forming step S07 shown in FIG. 2, as shown in FIG. 10, the resist protective film Mm is formed on the surface of the resist layer M by anisotropic plasma processing.

The resist protective film Mm is a film capable of protecting the resist layer M from being etched in the dry-etching step S04 and the ashing step S05 to be carried out after the third cycle.

In the resist protective film-forming step S07, the conditions for film formation are set such that the deposition rate of the resist protective film Mm becomes higher than that of the deposition layer D2. For example, the deposition rate of the resist protective film Mm is set to be approximately 1.5 times higher than the deposition rate of the deposition layer D2. In the plasma CVD method used in the resist protective film-forming step S07, a gas capable of forming $Si_xO_y\alpha_z$, for example, a mixed gas of $SiF_4$ and $O_2$, a mixed gas of $SiCl_4$ and $O_2$, a mixed gas of $SiH_4$ and $O_2$, TEOS (Tetraethyl orthosilicate, Tetraethoxysilane), or the like is used. Accordingly, it is possible to form the resist protective film Mm including a film configuration of SiOF. The plasma CVD method is an example of a plasma film formation method.

Here, in the case of using the mixed gas of $SiF_4$ and $O_2$ in the resist protective film-forming step S07, it is possible to use $SiF_4$ gas common to the gas used in the dry-etching step S04. In this case, since the gas supply devices can be common in the configuration of the plasma-processing apparatus, it is preferable.

A SiOF film has a configuration similar to that of a $SiO_2$ film. Accordingly, regarding the SiOF film, the thickness of the resist protective film Mm does not decrease in the deposition step S03, the dry-etching step S04, and the ashing step S05, which constitute the cycle including the etching step to be carried out after the third cycle.

That is, the resist protective film Mm can prevent the thickness of the resist layer M from being reduced in the deposition step S03, the dry-etching step S04, and the ashing step S05, which constitute the cycle including the etching step to be carried out after the third cycle.

Although the resist protective film Mm is formed on the surface of the resist layer M by the anisotropic plasma processing, the resist protective film Mm is not formed on the side walls VSq and VLq of the recess patterns VS and VL. Furthermore, the resist protective film Mm is not formed on the bottom portions VSb2 and VLb2 of the recess patterns VS and VL. This is because the aspect ratio of the recess patterns VS and VL is set to be greater than or equal to a predetermined value in the depth-determining step S06a and the resist protection-determining step S06.

In the resist protective film-forming step S07 that is firstly carried out after the second cycle has been carried out, the plasma-processing apparatus 10 described below is used in order to carry out the plasma processing with high anisotropy.

In this situation, in the plasma-processing apparatus 10 used in the resist protective film-forming step S07, the frequency $\lambda 2$ of the power applied to the second electrode E2 located at the inner-periphery side described below can be set higher than the frequency $\lambda 3$ of the power applied to the third electrode E3 located at the outer-periphery side thereof. Specifically, for example, the frequency $\lambda 2$ may be 13.65 MHz, and the frequency $\lambda 3$ may be 2 MHz. Note that, even in the case of carrying out the resist protective film-forming step S07 after the third cycle, the same conditions as those of the aforementioned resist protective film-forming step S07 are adopted.

The processing conditions of the plasma-processing apparatus 10 used in the resist protective film-forming step S07 are the same as those of the dry-etching step S04 and the ashing step S05. Particularly, the value of the power with the frequency $\lambda 2$ applied to the second electrode E2 located at the inner-periphery side described below can be higher than the value of the power of the deposition step S03 of the second cycle and can be set to be the same as the value of the power of the dry-etching step S04 of the second cycle and the value of the power of the ashing step S05 of the second cycle.

Moreover, even in the resist protective film-forming step S07, in the plasma-processing apparatus 10, the value of the power with the frequency $\lambda 2$ applied to the second electrode E2 located at the inner-periphery side described below can be set to be the same as the value of the power with the frequency $\lambda 3$ applied to the third electrode E3 located at the outer-periphery.

Additionally, in the resist protective film-forming step S07, a bias voltage may not be applied in a similar way to the case of the deposition step S03. The ambient pressure of the resist protective film-forming step S07 can be set to be the same as the ambient pressures of the dry-etching step S04 of the second cycle and the ashing step S05.

In the state in which the resist protective film Mm having the configuration such as SiOF is formed on the surface of the resist layer M, in the case of carrying out the ashing step S05 of the subsequent third cycle, it is possible to prevent the resist layer M from being consumed.

However, the resist protective film Mm having the configuration such as SiOF is gradually consumed by the anisotropic plasma etching processing using a fluorocarbon gas such as a CF-based gas, that is, $CHF_3$, $C_2F_6$, $C_2F_4$, $C_4F_8$, or the like which is used in the deposition step S03 to be carried out after the third cycle, $SF_6$ or $NF_3$, $SiF_4$ serving as a silicon compound added to an etching gas, $O_2$, $N_2$, $N_2O$, NO, $NO_x$, or $CO_2$ serving as a reactant added to a gas, for example, a mixed gas of $SF_6$ and $O_2$ used as an etching gas in the dry-etching step S04.

Consequently, regarding the film thickness of the resist protective film Mm, the film thickness of the resist protective film Mm is set such that each of the recess patterns VS and VL reaches a desired depth and such that the predetermined number of cycles can be carried out.

Furthermore, in the case in which the number of cycles reaches the predetermined number of cycles, in order to recover the film thickness of the consumed resist protective film Mm, the resist protective film Mm is formed on the surface of the resist layer M again by further carrying out the resist protective film-forming step S07 as described below.

In the silicon dry etching method according to the embodiment, the deposition step S03, the dry-etching step S04, and the ashing step S05 serve as one cycle as shown in FIG. 2, and the cycle is repetitively carried out. Consequently, the depths of the recess patterns VS and VL further become large. Moreover, the resist protective film Mm is formed on the surface of the resist layer M by carrying out the resist protective film-forming step S07 every predetermined cycle number, that is, after the cycles are carried out at a predetermined frequency.

After the resist protective film-forming step S07 is carried out, the step proceeds to the next cycle, that is, the third cycle including the etching step.

Next, the case of proceeding with the third cycle will be described.

Figure 11:
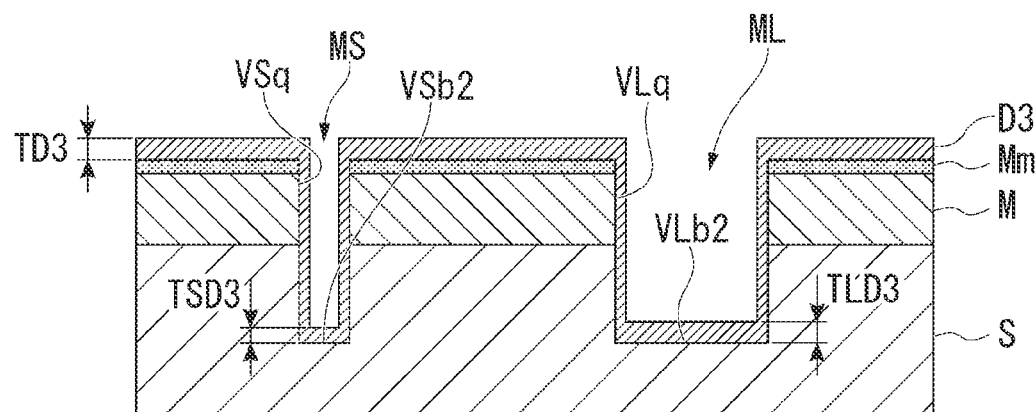
FIG. 11 is a cross-sectional view showing a step of the etching method according to the first embodiment of the invention.

FIG. 11 is a cross-sectional view showing a step of the silicon dry etching method according to the embodiment.

In the deposition step S03 shown in FIG. 2 of the third cycle, a deposition layer D3 made of a polymer such as fluorocarbon or the like is formed on the surface of the resist protective film Mm by anisotropic plasma processing as shown in FIG. 11. Consequently, in the dry-etching step S04 to be carried out after the deposition step S03 of the third cycle, it is possible to protect the side walls of the recess pattern VS and the recess pattern VL from being etched.

In this situation, although the film thickness of the resist protective film Mm slightly decreases, the resist protective film Mm almost remains in the deposition step S03.

The deposition layer D3 is formed in order to protect the side walls VSq and VLq of the recess patterns VS and VL from being etched, respectively, and in order to limitedly carry out etching with respect to the bottom portions VSb2 and VLb2 of the recess patterns VS and VL, respectively. Consequently, the vertical side walls VSq and VLq are obtained in the dry-etching step S04, which is etching using a fluorine compound.

The deposition layer D3 is formed on the surface of the resist protective film Mm and the bottom portions VSb2 and VLb2 of the recess patterns VS and VL. Moreover, although FIG. 11 shows that the deposition layer D3 is on the side walls VSq and VLq of the recess patterns VS and VL, practically, the deposition layer D3 is almost not formed on the side walls VSq and VLq.

The deposition step S03 of the third cycle is the same as that of the second cycle. That is, an anisotropic plasma processing is carried out using a fluorocarbon gas such as $CHF_3$, $C_2F_6$, $C_2F_4$, $C_4F_8$, or the like. In the deposition step S03, the plasma-processing apparatus 10 described below is used in order to carry out the plasma processing with high anisotropy.

In the deposition step S03 of the third cycle, in the plasma-processing apparatus 10, the frequency $\lambda 2$ of the power applied to the second electrode E2 located at the inner-periphery side thereof described below can be set higher than the frequency $\lambda 3$ of the power applied to the third electrode E3 located at the outer-periphery side thereof. Specifically, for example, the frequency $\lambda 2$ may be 13.65 MHz, and the frequency $\lambda 3$ may be 2 MHz.

In this situation, the setting conditions of the plasma-processing apparatus 10 in the deposition step S03 of the third cycle may be the same as those of at least one of the deposition step S03 of the first cycle and the deposition step S03 of the second cycle.

Additionally, in the deposition step S03 of the third cycle, in the plasma-processing apparatus 10, the value of the power with the frequency $\lambda 2$ applied to the second electrode E2 located at the inner-periphery side described below can be set lower than the values of the power of the dry-etching step S04 and the ashing step S05 described later. Furthermore, in the plasma-processing apparatus 10, a bias voltage may not be applied to a first electrode 12.

In the atmosphere in which the deposition step S03 of the third cycle is carried out, a predetermined pressure is set, and a deposition process is carried out. Additionally, in the deposition step S03 of the third cycle, it is also possible to use the same setting conditions as those of at least one of the deposition step S03 of the first cycle and the deposition step S03 of the second cycle.

The film thickness of the deposition layer D3 formed by the deposition step S03 of the third cycle is the same as that of the deposition step S03 of the second cycle. That is, the film thickness of the deposition layer D3 formed on the bottom portion VLb2 corresponding to the opening pattern ML having a large diameter becomes larger than the film thickness of the deposition layer D3 formed on the bottom portion VSb2 corresponding to the opening pattern MS having a small diameter. Note that, the film thickness of the deposition layer D3 formed on the bottom portion VLb2 of the opening pattern ML becomes equal to or smaller than the film thickness of the deposition layer D3 formed on the surface of the resist protective film Mm located outside the opening patterns MS and ML.

That is, regarding the film thickness of the deposition layer D3, the film thicknesses gradually become smaller in the order of the film thickness TD3 of the deposition layer D3 formed on the surface of the resist protective film Mm positioned outside the opening patterns MS and ML, the film thickness TLD3 of the deposition layer D3 formed on the bottom portion VLb2 of the opening pattern ML, and the film thickness TSD3 of the deposition layer D3 formed on the bottom portion VSb2 of the opening pattern MS.

In the deposition step S03 of the third cycle, the deposition coverage of the deposition layer D3 of the bottom portions VSb2 and VLb2 corresponding to the opening patterns MS and ML, respectively, can be controlled so as to obtain optimized deposition coverage by setting deposition conditions as described above. Here, the preferred conditions for forming the deposition coverage are those that shorten a processing time required for causing the deposition layer D3 having a necessary film thickness to be formed on the bottom portions VSb2 and VLb2. That is, the preferred conditions for forming the deposition coverage are those that increase the film-formation rate at which the deposition layer D3 is formed on the bottom portions VSb2 and VLb2.

Furthermore, in the deposition step S03 of the third cycle, the preferred conditions for forming the deposition coverage are those that control the deposition coverage in accordance with the etching depth and the aspect ratio. That is, as described below, even in the case in which the aspect ratios are changed depending on variation in the depths from the bottom portions VSb1 and VLb1 to the bottom portions VSb2 and VLb2, it is possible to form the deposition layer D3 having a desired thickness at a predetermined film-formation rate.

Moreover, the preferred conditions for forming the deposition coverage are those that improve uniformity and reliability with respect to the deposition layer D3 formed on the bottom portion VSb2 and improve uniformity and reliability with respect to the deposition layer D3 formed on the bottom portion VLb2.

Furthermore, the deposition step S03 of the third cycle can be carried out in a similar way to the case of at least one of the deposition step S03 of the first cycle and the deposition step S03 of the second cycle.

Figure 12:
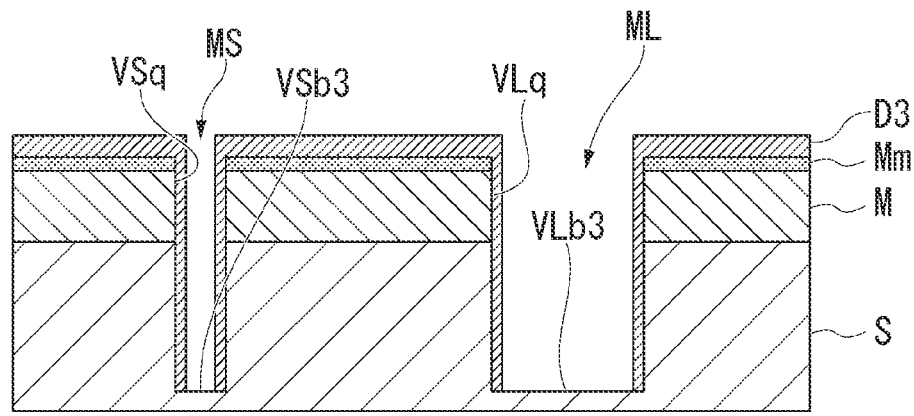
FIG. 12 is a cross-sectional view showing a step of the etching method according to the first embodiment of the invention.

FIG. 12 is a cross-sectional view showing a step of the silicon dry etching method according to the embodiment.

In the dry-etching step S04 of the third cycle shown in FIG. 2, the bottom portions VSb2 and VLb2 corresponding to the opening patterns MS and ML are etched by anisotropic plasma etching as shown in FIG. 12, the positions of the bottom portions VSb2 and VLb2 are lowered, and thereby the bottom portions VSb3 and VLb3 are formed.

In this situation, although the film thickness of the resist protective film Mm slightly decreases, the resist protective film Mm almost remains in the dry-etching step S04.

In this situation, the depths of the bottom portion VSb3 corresponding to the opening pattern MS and the bottom portion VLb3 corresponding to the opening pattern ML formed by the dry-etching step S04 of the third cycle are set to be uniform by the processing conditions of the dry-etching step S04 of the third cycle and the plasma anisotropy thereof and the difference between the film thickness of the deposition layers D3 formed by the deposition step S03.

Particularly, the film thickness TSD3 of the deposition layer D3 formed on the bottom portion VSb2 corresponding to the opening pattern MS is smaller than the film thickness TLD3 of the deposition layer D3 formed on the bottom portion VLb2 corresponding to the opening pattern ML. Moreover, the etching amount with respect to the bottom portion VSb2 corresponding to the opening pattern MS is smaller than the etching amount with respect to the bottom portion VLb2 corresponding to the opening pattern ML. Therefore, the film thickness of the deposition layer formed by the aforementioned deposition and the etching amount of the aforementioned etching are balanced, and the depth of the bottom portion VSb3 corresponding to the opening pattern MS and the depth of the bottom portion VLb3 corresponding to the opening pattern ML are uniform.

Additionally, an effect of the etching with respect to the side walls VSq and VLq corresponding to the opening patterns MS and ML, respectively, may be extremely reduced by the processing conditions of the dry-etching step S04 of the third cycle and the plasma anisotropy thereof and by the deposition layer D3. For this reason, the side walls VSq and VLq are vertical to the surface of the silicon substrate S. Each of the side walls VSq and VLq substantially has a plane. Accordingly, the side walls VSq and VLq are formed without irregularities so as to extend in the depth direction.

That is, as the recess patterns VS and VL, the bottom portions VSb3 and VLb3 are formed so as to have a uniform diameter.

Also in the dry-etching step S04 of the third cycle, the plasma-processing apparatus 10 described below is used in order to carry out the plasma processing with high anisotropy.

In this situation, the processing conditions of the plasma-processing apparatus 10 used in the dry-etching step S04 of the third cycle are the same as those of the dry-etching step S04 of the second cycle. That is, the frequency $\lambda 2$ of the power applied to the second electrode E2 located at the inner-periphery side described below can be set higher than the frequency $\lambda 3$ of the power applied to the third electrode E3 located at the outer-periphery side. Specifically, for example, the frequency $\lambda 2$ may be 13.65 MHz, and the frequency $\lambda 3$ may be 2 MHz.

Moreover, also in the dry-etching step S04 of the third cycle, the setting conditions of the plasma-processing apparatus 10 are the same as those of the second cycle. Particularly, the value of the power with the frequency $\lambda 2$ applied to the second electrode E2 located at the inner-periphery side described below can be higher than the value of the power of the deposition step S03 of the third cycle and can be set to be the same as the value of the power of the ashing step S05 of the third cycle.

Moreover, also in the dry-etching step S04 of the third cycle, the setting conditions of the plasma-processing apparatus 10 are the same as those of the second cycle. That is, the value of the power with the frequency $\lambda 2$ applied to the second electrode E2 located at the inner-periphery side described below can be set to be the same as the value of the power with the frequency $\lambda 3$ applied to the third electrode E3 located at the outer-periphery.

Furthermore, the setting conditions of the plasma-processing apparatus 10 used in the dry-etching step S04 of the third cycle are the same as those of the dry-etching step S04 of the second cycle. It is preferable to apply a bias voltage with the frequency $\lambda 1$ to the first electrode 12. The frequency $\lambda 1$ can be set lower than the frequency $\lambda 3$ of the power applied to the third electrode E3 located at the outer-periphery. The frequency $\lambda 1$ may be, for example, 400 kHz.

Moreover, the anisotropic plasma etching of the dry-etching step S04 of the third cycle is the same as the dry-etching step S04 of the second cycle. That is, the mixed gas of $SF_6$ and $O_2$ is decomposed by plasma, and anisotropic etching with respect to Si is carried out. For this reason, Si is etched by the F-radical generated due to decomposition of $SF_6$ (F+Si→$SiF_4$). This etching reaction occurs in isotropic etching. In order to carry out anisotropic etching, the etching reaction with respect to the side walls VSq and VLq may be suppressed by forming a protective film that adheres to the side walls VSq and VLq.

The anisotropic plasma etching using the mixed gas of $SF_6/O_2$ in the dry-etching step S04 of the third cycle is the same as the dry-etching step S04 of the second cycle. That is, the deposition layer D3 is removed from the side walls VSq and VLq corresponding to the opening patterns MS and ML, respectively, and the side walls VSq and VLq are exposed.

Here, the anisotropic plasma etching using the mixed gas of $SF_6/O_2$ in the dry-etching step S04 of the third cycle is the same as the dry-etching step S04 of the second cycle. That is, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, in the dry-etching step S04 of the third cycle, $SiF_4$ can be used as an etching gas in order to prevent lack of the etching product of $SiF_4$ in a similar way to the case of the dry-etching step S04 of the second cycle.

Moreover, the dry-etching step S04 of the third cycle is the same as the dry-etching step S04 of the second cycle. That is, $SF_6$ or $NF_3$ is used as an etching gas, $SiF_4$ serving as a silicon compound is added to the etching gas, and $O_2$, $N_2$, $N_2O$, NO, $NO_x$, or $CO_2$ which serves as a reactant is added to the gas. Accordingly, the bottom portions VSb2 and VLb2 can be intensively etched.

Additionally, the processing time of the dry-etching step S04 of the third cycle can also be longer than the processing time of at least one of the dry-etching step S04 of the first cycle and the dry-etching step S04 of the second cycle.

Figure 13:
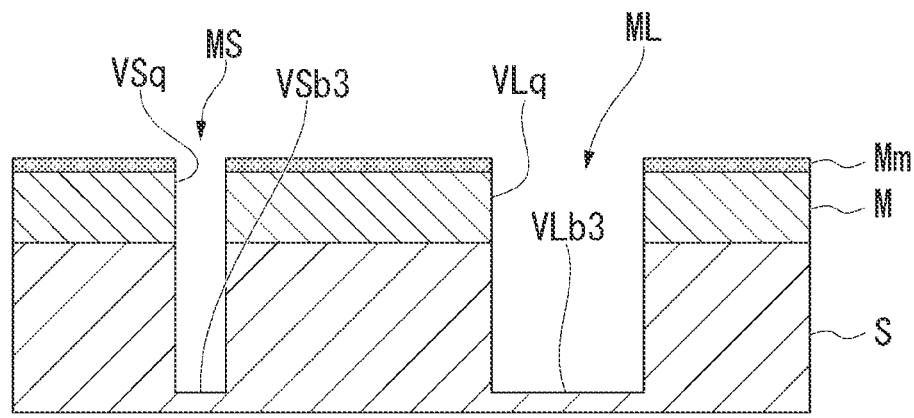
FIG. 13 is a cross-sectional view showing a step of the etching method according to the first embodiment of the invention.

FIG. 13 is a cross-sectional view showing a step of the silicon dry etching method according to the embodiment.

In the ashing step S05 of the third cycle shown in FIG. 2, the remaining deposition layer D3 is removed after the dry-etching step S04 of the third cycle is completed as shown in FIG. 13.

Particularly, in the ashing step S05 of the third cycle, the ashing conditions are set so as to reliably remove the deposition layer D3 that remains on the region close to the inner-peripheries of the opening pattern MS and the opening pattern ML of the resist layer M and formed on the region close to the surface of the resist protective film Mm.

The ashing step S05 of the third cycle is the same as at least one of the ashing step S05 of the first cycle and the ashing step S05 of the second cycle. After the dry-etching step S04 of the third cycle is completed, the deposition layer D3 adhered to the surface of the resist protective film Mm, the deposition layer D3 that remains on the region close to the inner-peripheries of the openings of the opening pattern MS and the opening pattern ML, and the deposition layers D3 that remain on the side walls VSq and VLq corresponding to the opening patterns MS and ML, respectively, are removed.

Furthermore, in the ashing step S05 of the third cycle, in the case in which the deposition layer D3 remains on the bottom portion VSb3 corresponding to the opening pattern MS and the deposition layer D3 remains on the bottom portion VLb3 corresponding to the opening pattern ML, the deposition layer D3 is removed.

In this situation, the film thickness of the resist protective film Mm does not change, and the resist protective film Mm substantially remains in the ashing step S05 of the third cycle.

Here, it is most important to remove the deposition layer D3 that remains at the inner-periphery position of the opening pattern MS and the deposition layer D3 that remains at the inner-periphery position of the opening pattern ML. When the deposition layer D3 remains without being removed, a next deposition layer D4 is further deposited on the remaining deposition layer D3 in the deposition step S03 of the next fourth cycle of the repetitive cycles to be carried out. In this case, the opening diameters of the opening pattern MS and the opening pattern ML of the resist layer M and the resist protective film Mm decrease.

As described above, in the case in which the opening diameters of the opening pattern MS and the opening pattern ML of the resist layer M decrease, even where the etching with a high degree of anisotropy is carried out in the dry-etching step S04 of the fourth cycle carried out next to the third cycle, the deposition layer D3 and the deposition layer D4 inhibit the etching plasma from reaching the bottom portion VSb3 and the bottom portion VLb3. Accordingly, the etching with respect to the bottom portion VSb3 and the bottom portion VLb3 is preferably not carried out, the side walls VSq and VLq corresponding to the opening patterns MS and ML, respectively, are not vertical, and therefore there is possibility that the shapes of the recess patterns VS and VL each become a tapered shape.

In contrast, in the state in which the deposition layer D3 does not remain at the inner-periphery position of the opening pattern MS and the deposition layer D3 does not remain at the inner-periphery position of the opening pattern ML, the deposition layer D4 is not further deposited on the remaining deposition layer D3 in the deposition step S03 of the fourth cycle carried out next to the third cycle of the repetitive cycles. For this reason, the opening diameters of the opening pattern MS and the opening pattern ML of the resist layer M and the resist protective film Mm can be maintained so as to have a predetermined size.

Therefore, in the dry-etching step S04 of the fourth cycle of the repetitive cycles, as a result of carrying out the etching with a high degree of anisotropy, reach of the etching plasma to the bottom portion VSb3 and the bottom portion VLb3 is not inhibited by the deposition layer D3 and the deposition layer D4. Consequently, the etching with respect to the bottom portion VSb3 and the bottom portion VLb3 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape, and it is possible to form each of the recess patterns VS and VL with a high-aspect ratio so as to have a uniform diameter in the depth direction.

It is important for the resist protective film Mm to maintain a sufficient film thickness in this situation so as to cause the resist layer M not to disappear in the ashing step S05.

In the ashing step S05 of the third cycle, the deposition layer D3 that remains at the inner-periphery positions of the opening patterns MS and ML is reliably removed as described above. For this purpose, in a similar way to the case of the ashing step S05 of the first cycle and the ashing step S05 of the second cycle, it is necessary to generate plasma with high anisotropy. Therefore, also in the ashing step S05 of the third cycle, the plasma-processing apparatus 10 described later is used.

In this situation, the processing conditions of the plasma-processing apparatus 10 used in the ashing step S05 of the third cycle are the same as those of at least one of the ashing step S05 of the first cycle and the ashing step S05 of the second cycle. That is, the frequency $\lambda 2$ of the power applied to the second electrode E2 located at the inner-periphery side described below can be set higher than the frequency $\lambda 3$ of the power applied to the third electrode E3 located at the outer-periphery side. Specifically, for example, the frequency $\lambda 2$ may be 13.65 MHz, and the frequency $\lambda 3$ may be 2 MHz.

Furthermore, the processing conditions of the plasma-processing apparatus 10 used in the ashing step S05 of the third cycle are the same as those of at least one of the ashing step S05 of the first cycle and the ashing step S05 of the second cycle. Particularly, the value of the power with the frequency $\lambda 2$ applied to the second electrode E2 located at the inner-periphery side described below can be higher than the value of the power of the deposition step S03 and can be set to be the same as the value of the power of the dry-etching step S04 of the third cycle.

Moreover, the processing conditions of the plasma-processing apparatus 10 used in the ashing step S05 of the third cycle are the same as those of at least one of the ashing step S05 of the first cycle and the ashing step S05 of the second cycle. That is, the value of the power with the frequency $\lambda 2$ applied to the second electrode E2 located at the inner-periphery side described below can be set to be the same as the value of the power with the frequency $\lambda 3$ applied to the third electrode E3 located at the outer-periphery.

Furthermore, the processing conditions of the plasma-processing apparatus 10 used in the ashing step S05 of the third cycle are the same as those of at least one of the ashing step S05 of the first cycle and the ashing step S05 of the second cycle. That is, it is preferable to apply a bias voltage with the frequency $\lambda 1$ to the first electrode 12. The frequency $\lambda 1$ can be set lower than the frequency $\lambda 3$ of the power applied to the third electrode E3 located at the outer-periphery. The frequency $\lambda 1$ may be, for example, 400 kHz.

Additionally, the processing conditions of the plasma-processing apparatus 10 used in the ashing step S05 of the third cycle are the same as those of at least one of the ashing step S05 of the first cycle and the ashing step S05 of the second cycle. Particularly, it is preferable to apply the bias voltage to the first electrode 12. The power of the bias voltage of the ashing step S05 of the third cycle can be set to be equal to the power of the bias voltage of the dry-etching step S04 of the third cycle or higher than the power of the bias voltage of the dry-etching step S04 of the third cycle.

In the ashing step S05 of the third cycle, it is possible to carry out the ashing by supply of $O_2$ gas. According to the anisotropic plasma processing using the $O_2$ gas, the deposition layer D3 is reliably removed and the side walls VSq and VLq are exposed at the portions close to the inner-peripheries of the opening patterns MS and ML, and the side walls VSq and VLq corresponding to the opening patterns MS and ML, respectively. At the same time, the ashing is carried out by supply of $O_2$ gas in the ashing step S05 of the third cycle. Here, since the resist protective film Mm is formed on the resist layer M, the resist layer M is not removed by $O_2$ plasma.

In the silicon dry etching method according to the embodiment, the deposition step S03, the dry-etching step S04, and the ashing step S05 which constitute one cycle are repetitively carried out as shown in FIG. 2. Consequently, the depths of the recess patterns VS and VL further become large.

Furthermore, as shown in FIG. 2, the silicon dry etching method according to the embodiment includes the depth-determining step S06a and the resist protection-determining step S06 to be carried out after the deposition step S03 to the ashing step S05 of the third cycle is completed.

In the depth-determining step S06a of the third cycle, it is determined whether to proceed to the subsequent resist protection-determining step S06. At this time, regarding the determination standard of the depth-determining step S06a, determination in accordance with the depths of the recess patterns VS and VL is carried out. In other words, the determination in accordance with the aspect ratio of the recess patterns VS and VL is carried out.

When it is determined that the depths of the recess patterns VS and VL are not sufficient in the depth-determining step S06a (determination result: NO), it is determined that the etching step of the subsequent cycle is necessary, and the step proceeds to the resist protection-determining step S06. In the resist protection-determining step S06, it is determined whether to proceed to the resist protective film-forming step S07 described below.

On the other hand, when it is determined that the depths of the recess patterns VS and VL are sufficient in the depth-determining step S06a (determination result: YES), the etching is completed, and the step proceeds to the post-treatment step S08.

In the resist protection-determining step S06 of the third cycle, it is determined whether to carry out the subsequent cycle including the subsequent etching step without carrying out the resist protective film-forming step S07 or whether the step proceeds to the resist protective film-forming step S07 described below.

Here, regarding the determination standard of the resist protection-determining step S06 of the third cycle, the determination in accordance with the depths of the recess patterns VS and VL, and the determination in accordance with the degree of etching with respect to the resist protective film Mm, that is, the determination in accordance with the degree of reduction in the thickness of the resist protective film Mm are carried out.

When the ashing step S05 carried out after the third cycle is completed, the depths of the recess patterns VS and VL or the aspect ratios thereof are sufficient values. Accordingly, regarding the determination standard of the resist protection-determining step S06 to be carried out after the third cycle, the determination in accordance with the degree of etching with respect to the resist protective film Mm is carried out, that is, the determination in accordance with the degree of reduction in the thickness of the resist protective film Mm is carried out.

In the resist protection-determining step S06 of the third cycle, the determination is carried out at the point in time after the deposition step S03 to the ashing step S05 of the third cycle are completed. Specifically, when it is determined that the film thickness of the resist protective film Mm is sufficient and the characteristics of protecting the resist layer M are obtained, that is, the resistance to etching is maintained in the deposition step S03 and the dry-etching step S04 of the fourth cycle to be next carried out, it is determined whether to carry out the fourth cycle for the subsequent cycle.

Furthermore, in the resist protection-determining step S06 of the third cycle, when it is predicted that the film thickness of the resist protective film Mm is not sufficient and the characteristics of protecting the resist layer M are not sufficiently obtained, that is, a sufficient resistance to etching is not obtained, it is determined that the step proceeds to the resist protective film-forming step S07.

In other cases, the determination of the resist protection-determining step S06 may be based on the measurement result obtained by measuring the film thickness of the resist protective film Mm after the third cycle is carried out. The determination may be based on an estimation of the resist protective film Mm maintaining a sufficient film thickness from the etching condition of the second cycle, and it is determined whether to proceed to the fourth cycle. In the determination based on the etching conditions, the degree of reduction in the thickness of the resist protective film Mm obtained by a predetermined condition is set in advance, and the determination is carried out based on the preset value.

Note that, in the case in which one cycle is constituted of the deposition step S03, the dry-etching step S04, and the ashing step S05 as described above in the processing steps of the silicon substrate S, after approximately 5 to 20 cycles are carried out, preferably, after approximately 8 to 12 cycles are carried out, one resist protective film-forming step S07 can be inserted between the cycles.

Next, the fourth cycle will be described.

Figure 14:
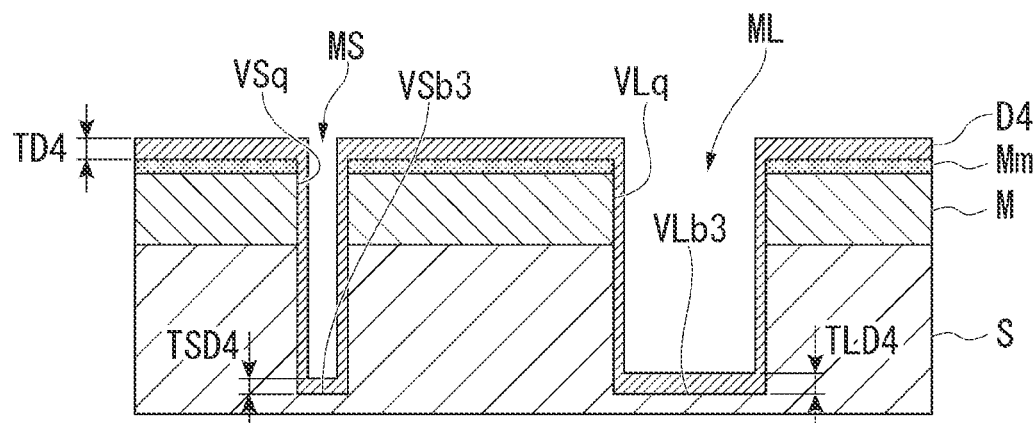
FIG. 14 is a cross-sectional view showing a step of the etching method according to the first embodiment of the invention.

FIG. 14 is a cross-sectional view showing a step of the silicon dry etching method according to the embodiment.

In the deposition step S03 shown in FIG. 2 of the fourth cycle, a deposition layer D4 made of a polymer such as fluorocarbon or the like is formed on the surface of the resist protective film Mm by anisotropic plasma processing as shown in FIG. 14. In the dry-etching step S04 to be carried out after the deposition step S03 of the fourth cycle, it is possible to protect the side walls of the recess pattern VS and the recess pattern VL from being etched.

In this situation, although the film thickness of the resist protective film Mm slightly decreases, the resist protective film Mm almost remains in the deposition step S03.

The deposition layer D4 is formed in order to protect the side walls VSq and VLq of the recess patterns VS and VL from being etched, respectively, and in order to limitedly carry out etching with respect to the bottom portions VSb3 and VLb3 of the recess patterns VS and VL, respectively. Consequently, the vertical side walls VSq and VLq are obtained in the dry-etching step S04, which is etching using a fluorine compound.

The deposition layer D4 is formed on the surface of the resist protective film Mm and the bottom portions VSb3 and VLb3 of the recess patterns VS and VL. Moreover, although FIG. 14 shows that the deposition layer D4 is on the side walls VSq and VLq of the recess patterns VS and VL, practically, the deposition layer D4 is almost not formed on the side walls VSq and VLq.

The deposition step S03 of the fourth cycle is the same as that of the third cycle. That is, an anisotropic plasma processing is carried out using a fluorocarbon gas such as $CHF_3$, $C_2F_6$, $C_2F_4$, $C_4F_8$, or the like. In the deposition step S03, the plasma-processing apparatus 10 described below is used in order to carry out the plasma processing with high anisotropy.

In the deposition step S03 of the fourth cycle, in the plasma-processing apparatus 10, the frequency $\lambda 2$ of the power applied to the second electrode E2 located at the inner-periphery side thereof described below can be set higher than the frequency $\lambda 3$ of the power applied to the third electrode E3 located at the outer-periphery side thereof. Specifically, for example, the frequency $\lambda 2$ may be 13.65 MHz, and the frequency $\lambda 3$ may be 2 MHz.

In this situation, the setting conditions of the plasma-processing apparatus 10 in the deposition step S03 of the fourth cycle may be the same as those of at least one of the deposition steps S03 of the first cycle to the third cycle.

Additionally, in the deposition step S03 of the fourth cycle, in the plasma-processing apparatus 10, the value of the power with the frequency $\lambda 2$ applied to the second electrode E2 located at the inner-periphery side described below can be set lower than the values of the power of the dry-etching step S04 and the ashing step S05 described later. Furthermore, in the plasma-processing apparatus 10, a bias voltage may not be applied to a first electrode 12.

In the atmosphere in which the deposition step S03 of the fourth cycle is carried out, a predetermined pressure is set, and a deposition process is carried out. Additionally, in the deposition step S03 of the fourth cycle, it is also possible to use the same setting conditions as those of at least one of the deposition steps S03 of the first cycle to the third cycle.

The film thickness of the deposition layer D4 formed in the deposition step S03 of the fourth cycle is the same as that of at least one of the deposition steps S03 of the first cycle to the third cycle. That is, the film thickness of the deposition layer D4 formed on the bottom portion VLb3 corresponding to the opening pattern ML having a large diameter becomes larger than the film thickness of the deposition layer D4 formed on the bottom portion VSb3 corresponding to the opening pattern MS having a small diameter. Note that, the film thickness of the deposition layer D4 formed on the bottom portion VLb3 of the opening pattern ML becomes equal to or smaller than the film thickness of the deposition layer D4 formed on the surface of the resist protective film Mm located outside the opening patterns MS and ML.

That is, regarding the film thickness of the deposition layer D4, the film thicknesses gradually become smaller in the order of the film thickness TD4 of the deposition layer D4 formed on the surface of the resist protective film Mm positioned outside the opening patterns MS and ML, the film thickness TLD4 of the deposition layer D4 formed on the bottom portion VLb3 of the opening pattern ML, and the film thickness TSD4 of the deposition layer D4 formed on the bottom portion VSb3 of the opening pattern MS.

In the deposition step S03 of the fourth cycle, the deposition coverage of the deposition layer D4 of the bottom portions VSb3 and VLb3 corresponding to the opening patterns MS and ML, respectively, can be controlled so as to obtain optimized deposition coverage by setting deposition conditions as described above. Here, the preferred conditions for forming the deposition coverage are those that shorten a processing time required for causing the deposition layer D4 having a necessary film thickness to be formed on the bottom portions VSb3 and VLb3. That is, the preferred conditions for forming the deposition coverage are those that increase the film-formation rate at which the deposition layer D4 is formed on the bottom portions VSb3 and VLb3.

Furthermore, in the deposition step S03 of the fourth cycle, the preferred conditions for forming the deposition coverage are those that control the deposition coverage in accordance with the etching depth and the aspect ratio. That is, as described below, even in the case in which the aspect ratios are changed depending on variation in the depths from the bottom portions VSb2 and VLb2 to the bottom portions VSb3 and VLb3, it is possible to form the deposition layer D4 having a desired thickness at a predetermined film-formation rate.

Moreover, the preferred conditions for forming the deposition coverage are those that improve uniformity and reliability with respect to the deposition layer D4 formed on the bottom portion VSb3 and improve uniformity and reliability with respect to the deposition layer D4 formed on the bottom portion VLb3.

In the dry-etching step S04 of the fourth cycle shown in FIG. 2, the bottom portions VSb3 and VLb3 corresponding to the opening patterns MS and ML are etched by anisotropic plasma etching, and the positions of the bottom portions VSb3 and VLb3 are lowered. Because of this, in the opening patterns MS and ML, bottom portions are formed at positions deeper than the positions of the bottom portions VSb3 and VLb3.

In this situation, although the film thickness of the resist protective film Mm slightly decreases, the resist protective film Mm almost remains in the dry-etching step S04.

Next, in the ashing step S05 of the fourth cycle shown in FIG. 2, the remaining deposition layer D4 is removed.

In this situation, the film thickness of the resist protective film Mm slightly decreases.

Furthermore, the depth-determining step S06a and the resist protection-determining step S06 of the fourth cycle are carried out. Based on the thickness of the resist protective film Mm, it is determined whether to insert the resist protective film-forming step S07 between the cycles after the aforementioned cycles are carried out at a predetermined frequency. Even in the case of not carrying out the resist protective film-forming step S07 or in the case of carrying out the resist protective film-forming step S07, the cycle including the dry-etching step S04 is carried out.

As a result, the recess pattern VS having the diameter of φS and the recess pattern VL having the diameter of φL are formed on the surface of the silicon substrate S so as to have the same depth.

Furthermore, in the post-treatment step S08 shown in FIG. 2, if necessary, the resist protective film Mm is removed by carrying out the processing similar to the dry-etching step S04. Moreover, the resist layer M is removed by carrying out a wet etching step or the processing similar to the ashing step S05. Consequently, the silicon dry etching method according to the embodiment is completed.

Note that, approximately 50 cycles can be used for the silicon dry etching method according to the embodiment.

In the silicon dry etching method according to the embodiment, the deposition step S03, the dry-etching step S04, and the ashing step S05 serve as one cycle as shown in FIG. 2, and the cycle is repetitively carried out. Furthermore, after the cycles are carried out at a predetermined frequency, the resist protective film-forming step S07 is inserted between the cycles. That is, the resist protective film-forming step S07 is carried out between the cycles. Accordingly, it is possible to form the recess patterns VS and VL having diameters different from each other so as to have the same depth as each other. That is, it is possible to form the recess patterns VS and VL each having a high-aspect ratio. Since the resist layer M made of a resin having a simple configuration by being patterned on the silicon substrate S is used, the recess patterns VS and VL can be formed on the silicon substrate S without using a HDM (hard mask) such as a metal or the like.

Note that, the number of cycles including the etching step is optionally set depending on the depths of the recess patterns VS and VL to be formed. Moreover, the ashing step S05 may not carried out every cycle. In this case, in the resist protection-determining step S06, determination is carried out based on the degree of remaining deposition layer formed on the inner-periphery of the opening patterns MS and ML for each cycle. Depending on the determination result, it is possible to determine whether to carry out the ashing step S05 at the same time.

Next, the plasma-processing apparatus used in the silicon dry etching method according to the embodiment will be described with reference to the drawings.

Figure 15:
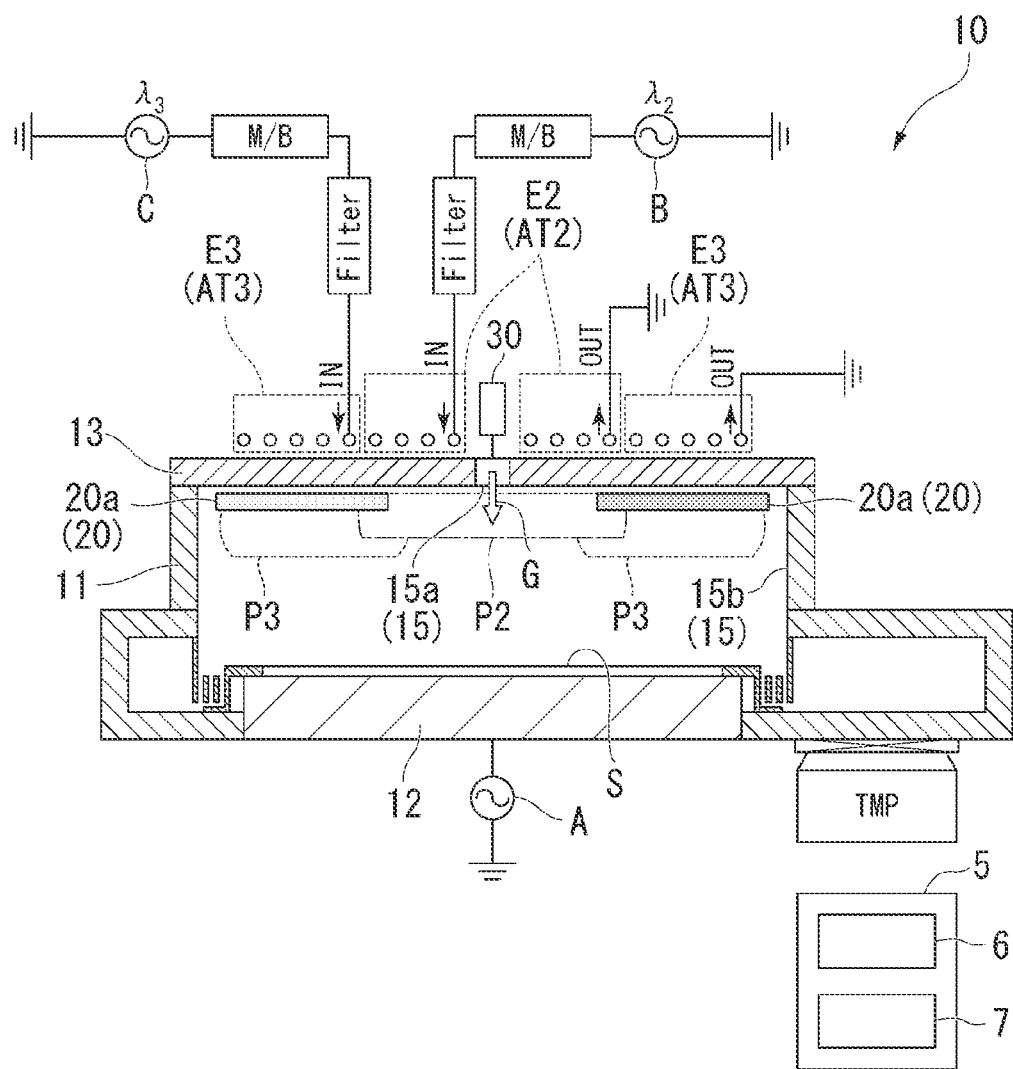
FIG. 15 is a schematic cross-sectional view showing an apparatus used in the etching method according to the first embodiment of the invention.
Figure 16:
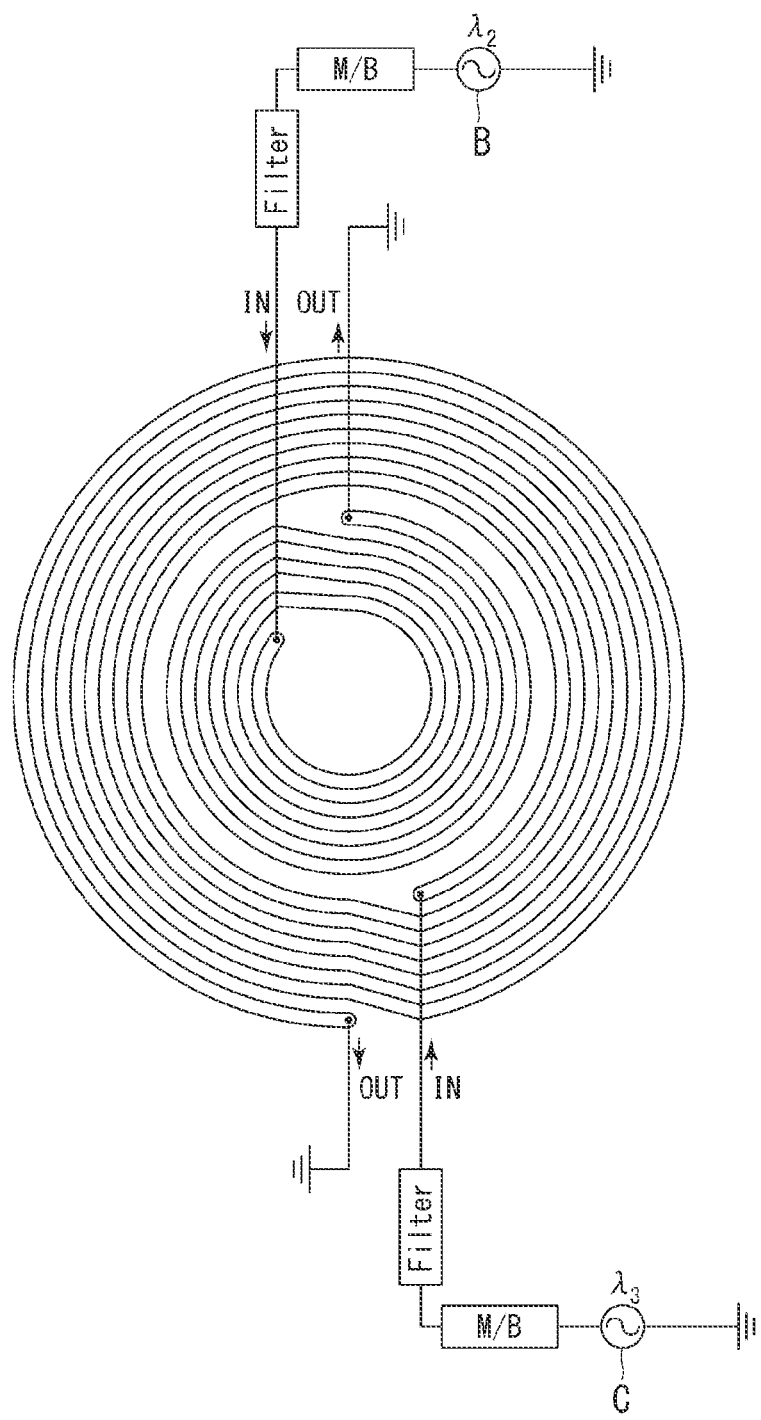
FIG. 16 is a view showing two spiral electrodes disposed at the inner-periphery region and the outer-periphery region and a power source that supplies powers of frequencies different from each other to the two spiral electrodes in the apparatus shown in FIG. 15, and is a plan view for explanation of a position at which the spiral electrodes are connected to the power source.
Figure 17:
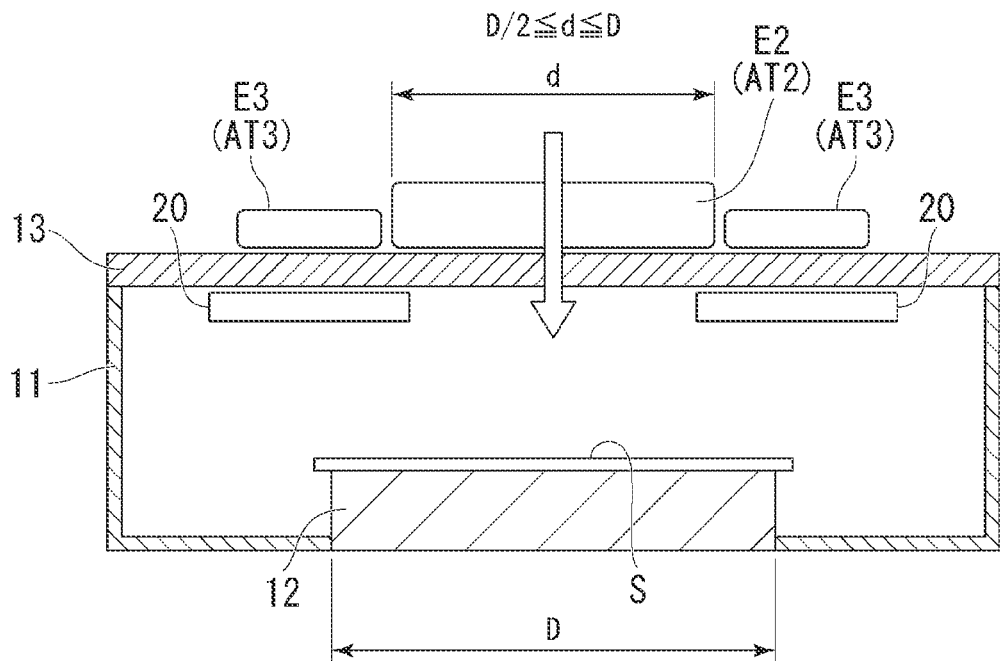
FIG. 17 is a cross-sectional view showing a relationship of a first electrode (outer diameter D) and a second electrode (outer diameter d) in the apparatus shown in FIG. 15.

FIG. 15 is a schematic cross-sectional view showing the plasma-processing apparatus used in the silicon dry etching method according to the embodiment. FIG. 16 is a plan view showing two spiral electrodes disposed at the inner-periphery region and the outer-periphery region and a power source that outputs powers of frequencies different from each other to the two spiral electrodes in the apparatus shown in FIG. 15. FIG. 16 is a plan view for explanation of a position at which the spiral electrodes are connected to the power source. FIG. 17 is a cross-sectional view showing a relationship of a first electrode (outer diameter D) and a second electrode (outer diameter d) in the apparatus shown in FIG. 15. In FIG. 15, reference numeral 10 indicates a plasma-processing apparatus.

The plasma-processing apparatus 10 includes a controller 5. The controller 5 is, for example, a computer configured of a circuit board on which an electronic circuit is formed. The electronic circuit is, for example, Integrated Circuit such as a LSI (Large-scale Integrated Circuit) or ASIC (Application Specific Integrated Circuit). The controller 5 includes a recording medium 6 and a processor 7. In the recording medium 6, for example, a computer program that executes the steps of the flowchart shown in FIG. 2 is stored. The processor 7 is configured to process various information based on the steps shown in the flowchart. Therefore, the controller 5 comprehensively controls the operation of the plasma-processing apparatus 10 and executes each of steps of the etching method according to the above-described embodiment. For example, the controller 5 controls the operation of the members or devices such as power sources A, B, and C, and a discharge device TMP, which constitute the plasma-processing apparatus 10 as described below.

The processor 7 carries out determinations in the depth-determining step S06a and the resist protection-determining step S06. Specifically, the processor 7 calculates the determination result in the depth-determining step S06a. Here, in accordance with the determination result, the processor 7 causes the processing step to proceed to the resist protection-determining step S06 or to proceed to the post-treatment step S08.

The processor 7 calculates the determination result in the resist protection-determining step S06. Here, in accordance with the determination result, the processor 7 causes the processing step to proceed to the resist protective film-forming step S07 or to proceed to the deposition step S03 of the next cycle.

The plasma-processing apparatus shown in FIGS. 18 to 22 described below also includes the controller 5.

The plasma-processing apparatus 10 according to the embodiment is configured to generate dual frequency ICP (Inductively Coupled Plasma). As shown in FIG. 15, the plasma-processing apparatus 10 includes, for example, a chamber 11 in which the pressure thereinside can be reduced by a discharge device TMP such as a vacuum pump. The plasma-processing apparatus is an apparatus that carries out plasma processing with respect to the silicon substrate S (target object) in the chamber 11.

The plasma-processing apparatus 10 includes, for example, an upper lid 13, a solid source 20a (20), a first electrode 12, a second electrode E2 (electrode, antenna AT2), a third electrode E3 (electrode, antenna AT3). The upper lid 13 is disposed at the upper end of the chamber 11. A gas introduction hole is formed at a center region 15a (13) of the upper lid 13. A gas introduction device 30 is connected to the gas introduction hole via a pipe or the like. The solid source 20a is disposed in the chamber 11 so as to face the upper lid 13. The second electrode E2 and the third electrode E3 are located above the upper lid 13 outside the chamber 11. The second electrode E2 is disposed at the inside region of the upper lid 13. The third electrode E3 is disposed at the outside region (the outer-periphery region) of the upper lid 13. The plasma-processing apparatus 10 includes the gas introduction device 30. The gas introduction device 30 is disposed at the center region 15a (15) of the upper lid 13.

In the plasma-processing apparatus 10, the solid source 20a is disposed in the chamber 11. When viewed from the vertical direction of the upper lid 13, the third electrode E3 is disposed so as to overlap the solid source 20a. Note that, the solid source 20a needs to be disposed so as to cover at least part of the third electrode E3. The solid source 20a is provided separately from the upper lid 13 of the chamber 11. The material used to form the solid source 20 includes, for example, silicon oxide.

The frequency of the power applied to the third electrode E3 is lower than the frequency of the power applied to the second electrode E2. In other words, the frequency of the power applied to the second electrode E2 is higher than the frequency of the power applied to the third electrode E3. That is, regarding the second frequency $\lambda 2$ and the third frequency $\lambda 3$, the plasma-processing apparatus 10 has the relationship of $\lambda 2 > \lambda 3$.

In the plasma-processing apparatus 10, the second electrode E2 is an electrode that applies power for generation of plasma and controls a plasma profile, and the third electrode E3 is an electrode that increases an electron temperature of the generated plasma.

In the plasma-processing apparatus 10, the gas introduction device 30 is disposed at the center region of the upper lid 13.

The first electrode 12 disposed inside the chamber 11 of the plasma-processing apparatus 10 is a flat plate-shaped electrode. The first electrode 12 serves as a support part that supports the silicon substrate S. Additionally, the first electrode 12 may be referred to as a substrate stage.

The plasma-processing apparatus 10 includes a high-frequency power source A (first power source) electrically connected to the first electrode 12, a high-frequency power source B (second power source) electrically connected to the spiral-shaped second electrode E2, and a high-frequency power source C (third power source) electrically connected to the spiral-shaped third electrode E3.

The high-frequency power source A can apply a bias voltage of the frequency (first frequency) $\lambda 1$ to the first electrode 12.

Both the spiral-shaped second electrode E2 and the spiral-shaped third electrode E3 are disposed outside of the chamber 11 and are disposed so as to face the first electrode 12 and sandwich a quartz plate forming the upper lid 13 of the chamber 11 therebetween. The spiral-shaped second electrode E2 is disposed along the upper lid 13 and at the center region of the upper lid. The spiral-shaped third electrode E3 is disposed along the upper lid 13 and at the outer-periphery region outside the second electrode E2.

The high-frequency power source B can apply an alternating voltage of the frequency (second frequency) $\lambda 2$ to the second electrode E2 (refer to FIG. 15). The second electrode E2 has a first portion and a second portion. The first portion is disposed at the inner-peripheral end of the spiral-shaped second electrode E2. The high-frequency power output from the high-frequency power source B is applied to the first portion. The second portion is disposed at the outer-peripheral end of the spiral-shaped second electrode E2. The second portion is connected to the ground (refer to FIG. 16).

The high-frequency power source C can apply an alternating voltage of the frequency (third frequency) $\lambda 3$ to the third electrode E3 (refer to FIG. 15). The third electrode E3 has a third portion and a fourth portion. The third portion is disposed at the inner-peripheral end of the spiral-shaped third electrode E3. The high-frequency power output from the high-frequency power source C is applied to the third portion. The fourth portion is disposed at the outer-peripheral end of the spiral-shaped third electrode E3. The fourth portion is connected to the ground (refer to FIG. 16).

The high-frequency power source B applies the alternating voltage of the second frequency $\lambda 2$ to the second electrode E2. The high-frequency power source C applies the alternating voltage of the third frequency $\lambda 3$ to the third electrode E3.

In the plasma-processing apparatus 10, the gas introduction device 30 introduces a processing gas G containing fluorine (F) into the inside of the chamber 11 through the gas introduction hole formed at the upper lid 13.

The plasma-processing apparatus 10 includes the solid source 20 for sputtering. The solid source 20 is disposed closer to the upper lid 13 than the first electrode 12 inside the chamber 11. The solid source 20 is located so as to face the first electrode 12. Particularly, the solid source 20 and the third electrode E3 are provided in the plasma-processing apparatus 10 such that the region at which the solid source 20 is disposed overlaps the region (outer region of the upper lid 13) at which the third electrode E3 is disposed when viewed from the vertical direction of the upper lid 13.

Plasma P2 generated due to the second electrode E2 and plasma P3 generated due to the third electrode E3 are generated in a space (region) close to the upper lid 13 inside the chamber 11 of the plasma-processing apparatus 10 having the aforementioned configuration. In the plasma-processing apparatus 10, since the solid source 20 and the third electrode E3 are provided such that the region at which the solid source 20 is disposed overlaps the region at which the third electrode E3 is disposed at the outside region of the upper lid 13, the solid source 20 is mainly sputtered by the plasma P3. Since the solid source 20 includes silicon oxide, for example, an oxygen element is sequentially introduced into the plasma (particularly, the plasma P3) from the solid source 20. Accordingly, in the plasma (particularly, the plasma P3), the oxygen element is not lacking.

Here, in order to control the relationship of the emission spectral characteristics of the oxygen element (O) and the fluorine element (F) and the ratio O/F of the oxygen element (O) to the fluorine element (F) to be in a predetermined state, the source power of the low frequency (2 MHz) can be controlled to be in a range of 0 W to 3 kW in a state in which the source power of the high frequency (13.56 MHz) is fixed to 2 kW.

In the plasma-processing apparatus 10, as shown in FIG. 17, the relationship of the first electrode 12 (outer diameter D) on which the silicon substrate S is mounted and the second electrode E2 (outer diameter d) disposed at the position at which the second electrode does not overlap the solid source 20 (disposed at the inside region of the upper lid 13) is set.

In the case in which the diameter d of the second electrode (antenna AT2) is less than or equal to half of the diameter D of the first electrode 12 serving as a support part (substrate stage) that supports the silicon substrate S, the plasma density at the outer-periphery region of the first electrode 12 is lowered, and the generation amount of the F-radical is significantly lowered. Consequently, the outer-periphery region of the silicon substrate S cannot be etched similarly to the case of etching the center region of the silicon substrate S.

In the case in which the diameter d of the second electrode is 1.3 or more times the diameter D of the first electrode 12 serving as a support part that supports the silicon substrate S, even where the low-frequency power is applied to the third electrode E3 (antenna AT3) and the oxygen element is supplied to the silicon substrate S from the solid source 20, since the solid source 20 is away from the silicon substrate S, the etching effect does not affect the outer-periphery region of the silicon substrate S.

Therefore, in the plasma-processing apparatus 10 according to the embodiment, when the oxygen element is supplied to the silicon substrate S from the solid source 20, it is preferable to satisfy the relational expression $D/2 \leq d \leq D$.

The silicon dry etching method according to the embodiment utilizes the etching stop effect by depositing the deposition layers D1 to D4 on the substrate. Accordingly, it is possible to prevent the RIE-lag from being generated on the silicon substrate S. Furthermore, even in the case of forming the recess patterns VS and VL having diameters ($\varphi$S, $\varphi$L, or the like) different from each other such as a hole, a trench, or the like, it is possible to form the resist protective film Mm on the resist layer M made of resin or the like using the same kinds of gas as those used in the etching step. Consequently, the aforementioned dry etching treatment can be carried out.

Furthermore, since it is not necessary to provide a hard mask made of a metal or the like, a step of forming a film made of a metal or the like is not necessary, a chamber for metal film formation is not necessary, and processing and an apparatus specialized for a metal material such as patterning, cleaning, or the like are also not necessary. As a result, the number of processes is reduced, the number of necessary apparatuses is reduced, and it is possible to reduce the cost of manufacturing.

Moreover, the deposition layer is removed for each cycle by carrying out the ashing step S05 of removing the deposition layers D1 to D4 after repeating formation of the deposition layer by the deposition step S03 and etching by the dry-etching step S04. Consequently, when the etching is carried out, the deposition layers D1 to D4 which are made of a $C_xF_y$-based polymer and are adhered to the side walls VSq and VLq corresponding to the regions of the opening patterns MS and ML are removed.

Furthermore, in the dry-etching step S04, the plasma-processing apparatus 10 uses dual frequency ICP (for example, 13.56 MHz, 2 MHz). Therefore, it is possible to continuously form the $SiO_x$ protective film on the side walls VSq and VLq by actively ionizing the added $O_2$ gas.

The resist protective film-forming step S07, the ashing step S05, the deposition step S03, and the dry-etching step S04 are carried out in the same chamber 11. Therefore, the dry etching can be carried out as an in-situ process in a state in which the deposition layers D1 to D4 adhered to the region close to the inner-periphery of the opening patterns MS and ML on the openings of the resist protective film Mm are removed.

Furthermore, it is possible to prevent a reduction in the thickness of the resist layer M by forming the resist protective film Mm capable of protecting the resist layer M from being etched in the resist protective film-forming step S07. Consequently, a hard mask such as a metal, silicon oxide, or the like is not necessary.

For this reason, additional processing and an additional apparatus for film formation of a hard mask layer, etching, cleaning, or the like are not used. Furthermore, it is possible to use a common gas in the resist protective film-forming step S07 and the dry-etching step S04.

In other cases, the following configurations can be adopted as the plasma-processing apparatus 10 according to the embodiment.

Figure 18:
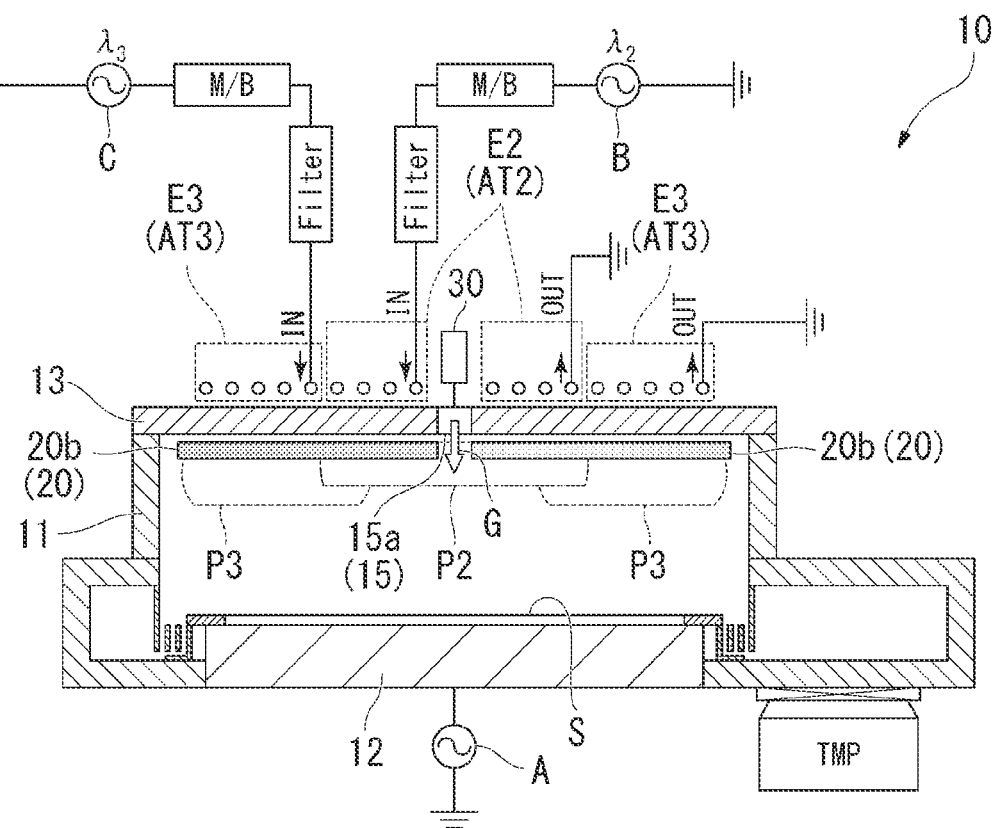
FIG. 18 is a schematic cross-sectional view showing another example of a manufacturing apparatus used in an etching method according to the first embodiment of the invention.

FIG. 18 is a schematic cross-sectional view showing another example of a plasma apparatus that carries out the processing in the embodiment.

In the plasma-processing apparatus 10 according to this example, as shown in FIG. 18, the gas introduction device 30 is connected to the center region 15a of the upper lid 13. The region at which a solid source 20b (20) is disposed is located so as to overlap the two electrodes (the second electrode E2 and the third electrode E3) when viewed from the vertical direction of the upper lid 13.

That is, in the chamber 11 of the plasma-processing apparatus 10 having the configuration shown in FIG. 18, the region at which the solid source 20b is disposed is located so as to overlap the second electrode E2 and the third electrode E3. Furthermore, the solid source 20b is positioned so as to cover the second electrode E2 and the third electrode E3 when viewed from the direction from the first electrode 12 to the upper lid 13. The solid source 20b is provided separately from the upper lid 13 of the chamber 11.

With this configuration, the solid source 20b (20) of the plasma-processing apparatus shown in FIG. 18 is preferentially sputtered by the plasma P3 (low-frequency plasma) generated due to the third electrode E3. Accordingly, the oxygen element is supplied to the silicon substrate S serving as a target object such that the oxygen element increases in the radial direction of the silicon substrate S.

Therefore, even in the plasma-processing apparatus shown in FIG. 18, in a similar way to the case of the plasma-processing apparatus shown in FIG. 15, it is possible to increase the degree of anisotropy of the plasma processing on the entire area of the silicon substrate S such as both the center region and the outer-periphery region of the silicon substrate. The shape of the side surface of the recess pattern formed on the silicon substrate is maintained in a substantially straight shape in the depth direction of the recess pattern.

Figure 19:
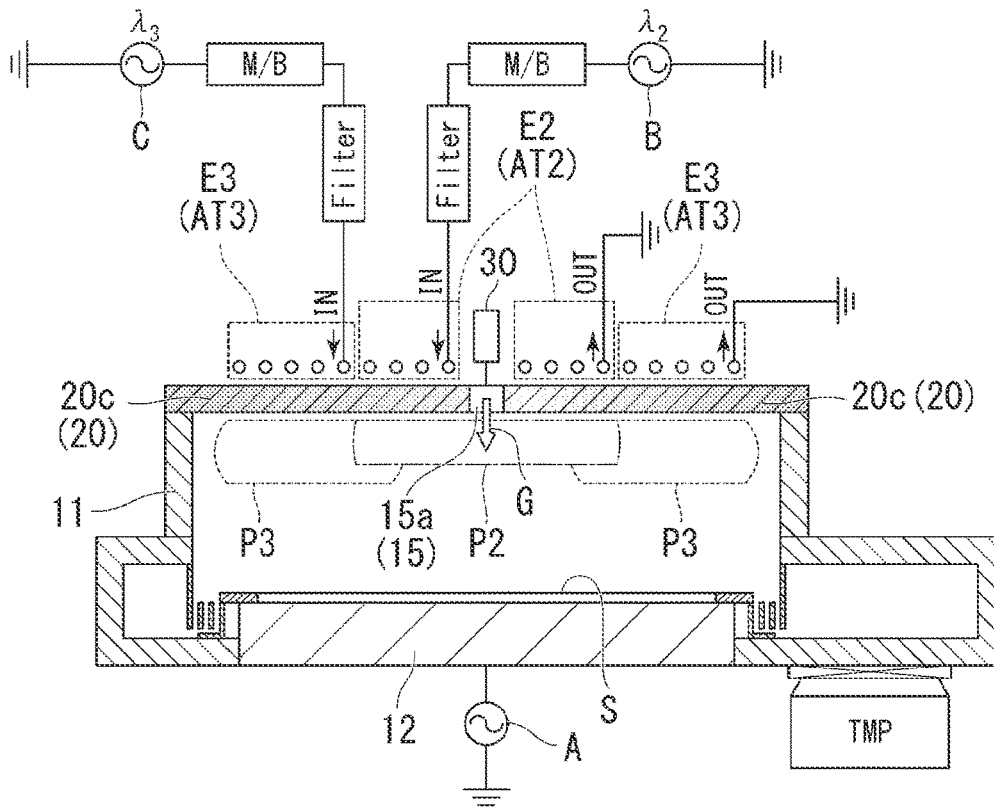
FIG. 19 is a schematic cross-sectional view showing the other example of a manufacturing apparatus used in an etching method according to the first embodiment of the invention.

FIG. 19 is a schematic cross-sectional view showing the other example of a plasma apparatus that carries out the processing in the embodiment.

In the plasma-processing apparatus 10 according to this example, as shown in FIG. 19, it is possible to obtain the same actions and effects as those of the plasma-processing apparatus shown in FIG. 18. In addition to this, in the plasma-processing apparatus shown in FIG. 19, the upper lid connected to the chamber 11 functions as a solid source. Consequently, a structure for holding a solid source in the chamber is not necessary. Moreover, since the upper lid connected to the chamber 11 is formed of a solid source, the state in which the plasmas P2 and P3 generated inside the chamber are electrically discharged can be further stabilized.

Therefore, even in the plasma-processing apparatus shown in FIG. 19, in a similar way to the case of the plasma-processing apparatus shown in FIG. 15, the shape of the side surface of the recess pattern formed on the silicon substrate is maintained in a substantially straight shape in the depth direction of the recess pattern on the entire area of the silicon substrate S such as both the center region and the outer-periphery region of the silicon substrate.

Figure 20:
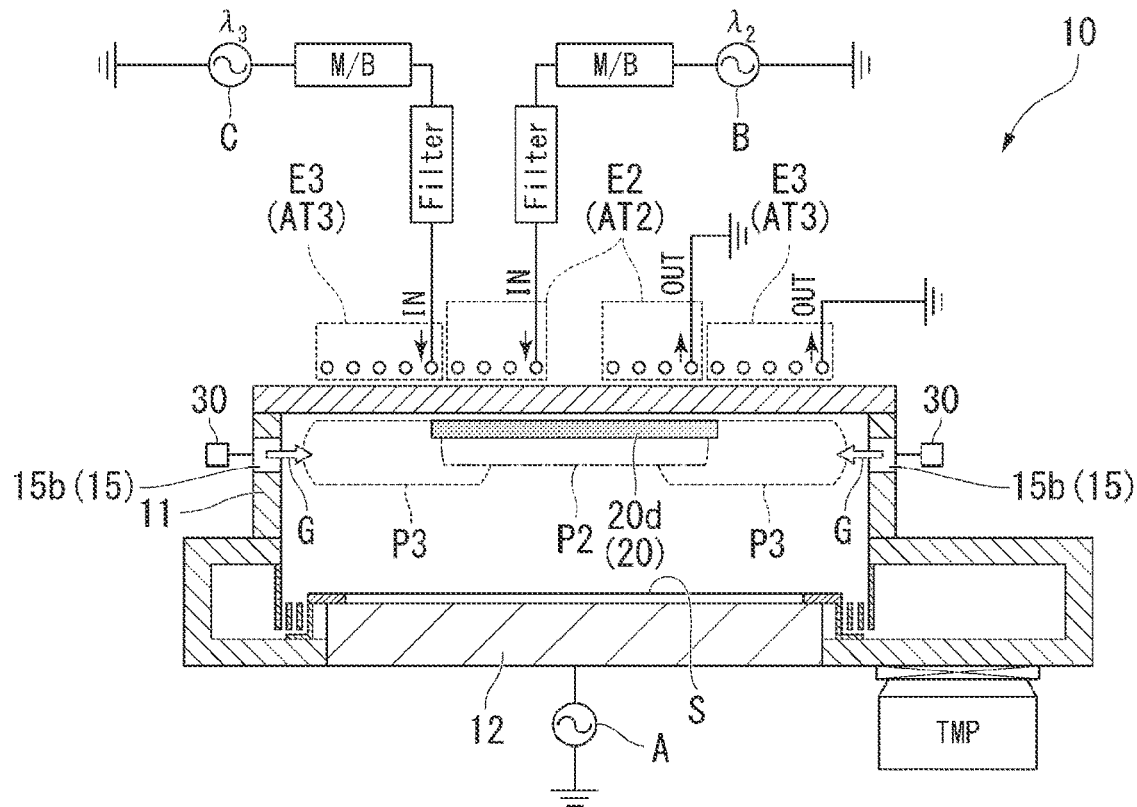
FIG. 20 is a schematic cross-sectional view showing the other example of a manufacturing apparatus used in an etching method according to the first embodiment of the invention.

FIG. 20 is a schematic cross-sectional view showing the other example of a plasma apparatus that carries out the processing in the embodiment.

In the plasma-processing apparatus 10 according to this example, as shown in FIG. 20, the gas introduction device 30 is connected to a side wall portion 15b (11) of the chamber 11. The region at which a solid source 20d (20) is disposed is located so as to overlap an inside electrode (second electrode E2) when viewed from the vertical direction of the upper lid 13.

In the plasma-processing apparatus 10 according to this example, the frequency λ2 of the power applied to the second electrode E2 is lower than the frequency of the power applied to the third electrode E3. Particularly, in the plasma-processing apparatus 10 shown in FIG. 20, the second frequency λ2 and the third frequency λ3 have the relationship of λ2<λ3. The gas introduction device 30 is connected to the side wall portion 15b (11) of the chamber 11.

In the case in which the gas introduction device 30 is disposed on the side wall portion 15b (11) of the chamber 11 in the plasma-processing apparatus 10 shown in FIG. 20, there is a tendency that a defect occurs at the center region of the silicon substrate S. Because of this, in the plasma-processing apparatus 10 according to this example, as shown in FIG. 20, the solid source 20d (20) is disposed at the position to overlap an inside electrode (second electrode E2).

Accordingly, the action and the effect which are obtained on the outer-periphery region of the silicon substrate S in the plasma-processing apparatus shown in FIG. 15 can be obtained on the center region of the silicon substrate S in the plasma-processing apparatus shown in FIG. 20.

Therefore, even in the plasma-processing apparatus shown in FIG. 20, in a similar way to the case of the plasma-processing apparatus shown in FIG. 15, the shape of the side surface of the recess pattern formed on the silicon substrate is maintained in a substantially straight shape in the depth direction of the recess pattern on the entire area of the silicon substrate S such as both the center region and the outer-periphery region of the silicon substrate.

Figure 21:
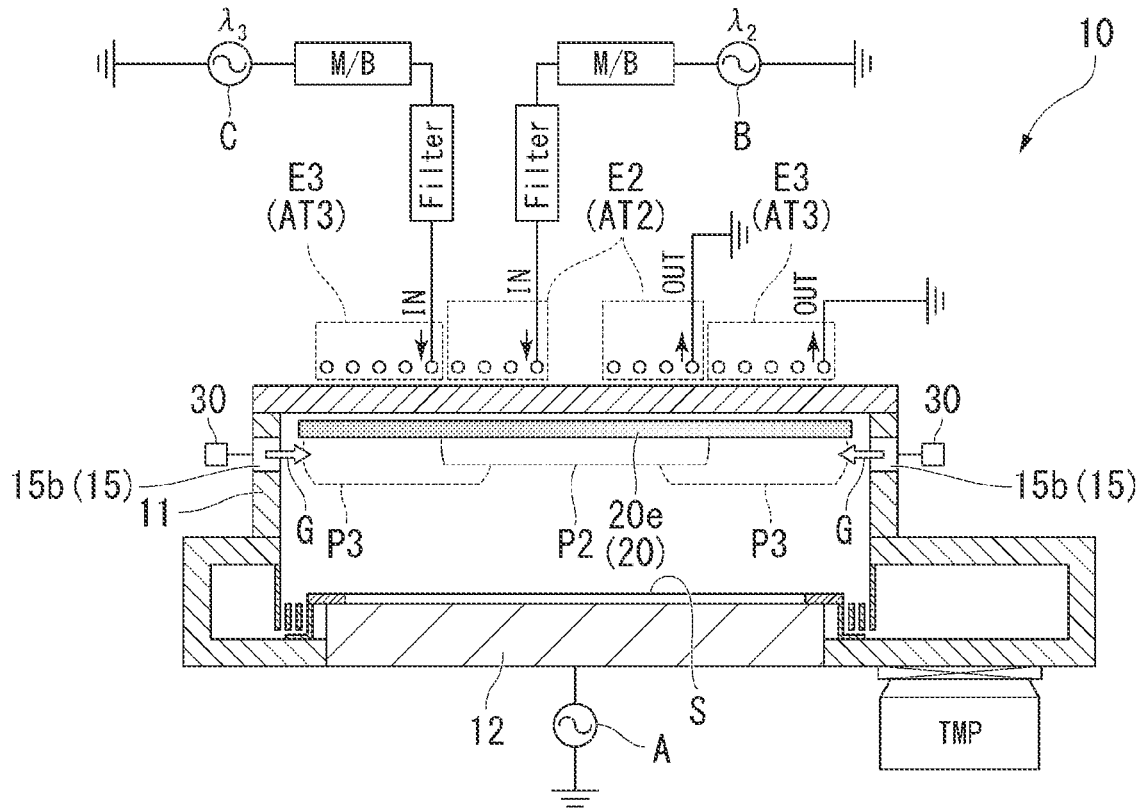
FIG. 21 is a schematic cross-sectional view showing the other example of a manufacturing apparatus used in an etching method according to the first embodiment of the invention.

FIG. 21 is a schematic cross-sectional view showing the other example of a plasma apparatus that carries out the processing in the embodiment.

In the plasma-processing apparatus 10 according to this example, as shown in FIG. 21, the gas introduction device 30 is connected to a side wall portion 15b (11) of the chamber 11. The region at which a solid source 20e (20) is disposed is located so as to overlap the two electrodes (the second electrode E2 and the third electrode E3) when viewed from the vertical direction of the upper lid 13.

That is, in the chamber 11 of the plasma-processing apparatus having the configuration shown in FIG. 21, the region at which the solid source 20e is disposed is located so as to overlap the second electrode E2 and the third electrode E3 and so as to cover both the electrodes. The solid source 20e is provided separately from the upper lid 13.

With this configuration, the solid source 20e (20) of the plasma-processing apparatus shown in FIG. 21 is preferentially sputtered by the plasma P2. Accordingly, the oxygen element is supplied to the silicon substrate S serving as a target object such that the oxygen element increases in the radial direction of the silicon substrate S.

Therefore, even in the plasma-processing apparatus shown in FIG. 21, in a similar way to the case of the plasma-processing apparatus shown in FIG. 20, the shape of the side surface of the recess pattern formed on the silicon substrate S is maintained in a substantially straight shape in the depth direction of the recess pattern on the entire area of the silicon substrate S such as both the center region and the outer-periphery region of the silicon substrate.

Figure 22:
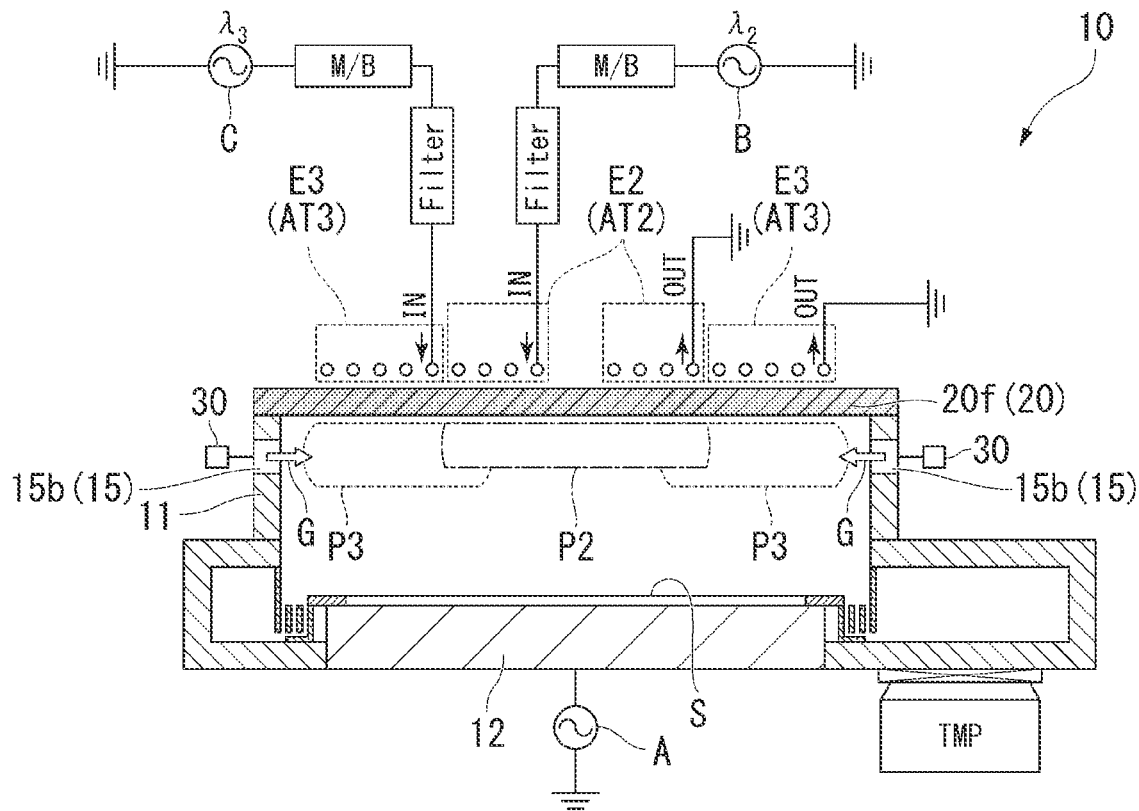
FIG. 22 is a schematic cross-sectional view showing the other example of a manufacturing apparatus used in an etching method according to the first embodiment of the invention.

FIG. 22 is a schematic cross-sectional view showing the other example of a plasma apparatus that carries out the processing in the embodiment.

In the plasma-processing apparatus 10 according to this example, as shown in FIG. 22, the upper lid of the chamber in the chamber is formed of a solid source 20f (20).

Consequently, in the plasma-processing apparatus 10 shown in FIG. 22 it is possible to obtain the same actions and effects as those of the plasma-processing apparatus 10 shown in FIG. 21.

In addition to this, in the plasma-processing apparatus 10 shown in FIG. 22, since the upper lid of the chamber functions as a solid source, a structure for holding a solid source in the chamber is not necessary. Moreover, since the upper lid of the chamber is formed of a solid source, a state in which the plasmas P2 and P3 generated inside the chamber are electrically discharged can be further stabilized.

Therefore, even in the plasma-processing apparatus shown in FIG. 22, in a similar way to the case of the plasma-processing apparatus shown in FIG. 21, the shape of the side surface of the recess pattern formed on the substrate is maintained in a substantially straight shape in the depth direction of the recess pattern on the entire area of the silicon substrate S such as both the center region and the outer-periphery region of the silicon substrate S.

Hereinafter, an etching method according to a second embodiment of the invention will be described with reference to the drawings.

Figure 23:
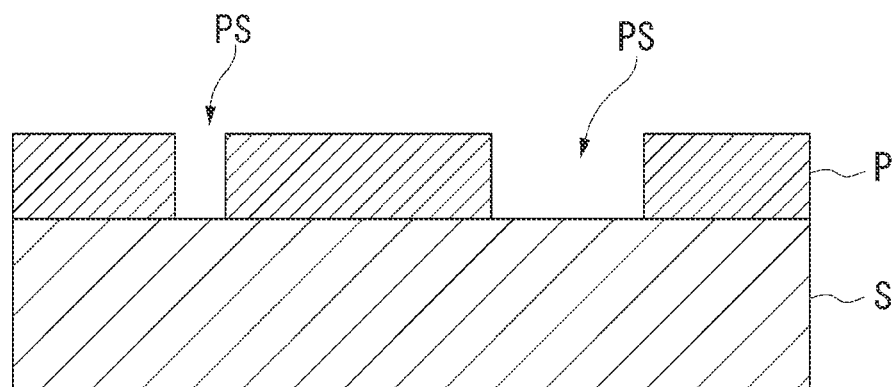
FIG. 23 is a schematic cross-sectional view showing a silicon substrate serving as a target object manufactured by an etching method according to a second embodiment of the invention.
Figure 24:
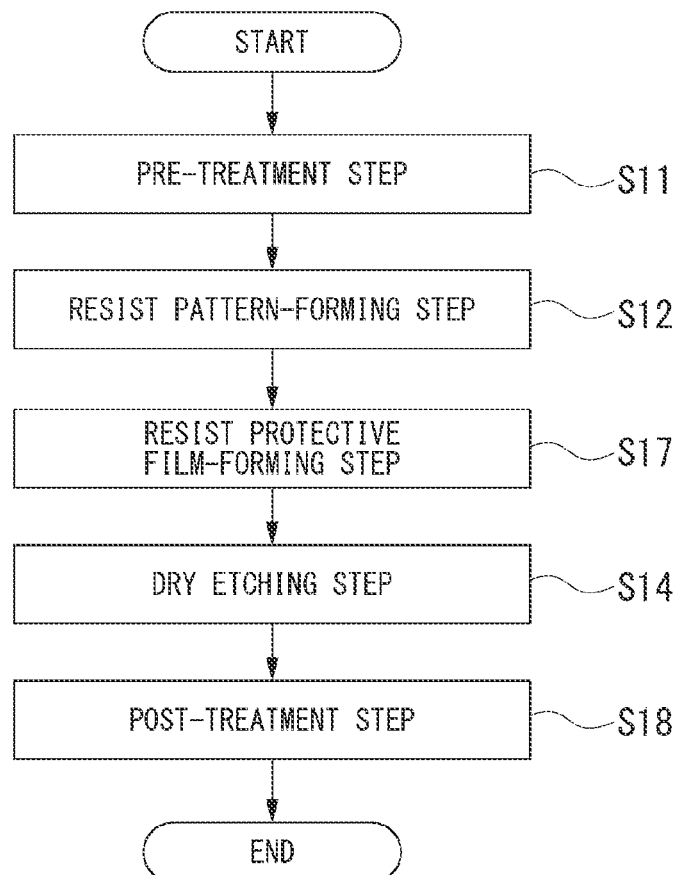
FIG. 24 is a flowchart showing the etching method according to the second embodiment of the invention.

FIG. 23 is a schematic cross-sectional view showing a substrate manufactured by an etching method according to the embodiment. FIG. 24 is a flowchart showing the etching method according to the embodiment.

In the etching method according to the embodiment, as shown in FIG. 23, a pattern is formed on a polyimide layer P formed on the silicon substrate S.

As shown in FIG. 24, the etching method according to the embodiment includes a pre-treatment step S11, a resist pattern-forming step S12, a resist protective film-forming step S17, a dry-etching step S14, and a post-treatment step S18.

In the pre-treatment step S11 shown in FIG. 24, the polyimide layer P with a predetermined thickness is formed on the entire surface of the silicon substrate S formed of a conductor, an insulator, or a semiconductor.

Figure 25:
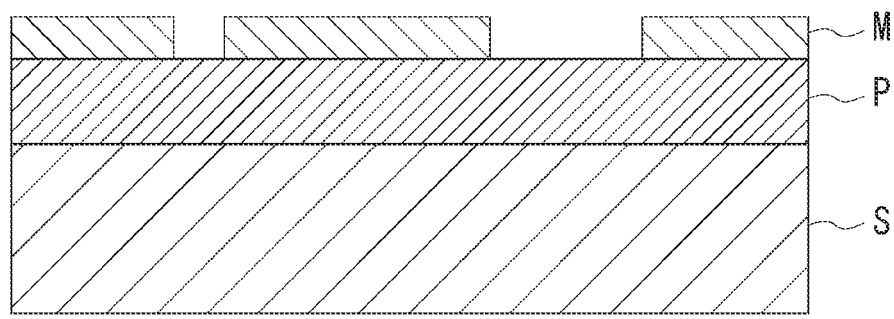
FIG. 25 is a cross-sectional view showing a step of the etching method according to the second embodiment of the invention.

FIG. 25 is a cross-sectional view showing a step of the etching method according to the embodiment.

In the resist pattern-forming step S12 shown in FIG. 24, as shown in FIG. 25, the resist layer M is formed on a surface of the polyimide layer P.

The resist layer M can be formed using a known resin resist. The resist layer M can be formed so as to have a predetermined thickness by appropriately selecting a condition from the conditions of a positive resist, a negative resist, an exposure wavelength, deposition methods, or the like. As a material used to form the resist layer M, for example, a photosensitive insulating material or other known materials may be used.

Moreover, in the resist pattern-forming step S12, as shown in FIG. 25, an opening pattern (mask pattern) that sets a processing region on the polyimide layer P is formed on the resist layer M. The opening pattern of the embodiment corresponds to, for example, the opening pattern MS described in the aforementioned embodiment. The opening pattern of the resist layer M corresponds to a shape of a recess pattern PS to be formed on the polyimide layer P.

Specifically, in the resist pattern-forming step S12, the resist layer M serving as a photoresist is formed on the polyimide layer P, and a treatment such as exposure, development, or the like is carried out with respect to the photoresist. Furthermore, the resist layer M having an opening pattern is formed by being subjected to a known removal treatment such as a wet etching treatment, a dry etching treatment, or the like.

Figure 26:
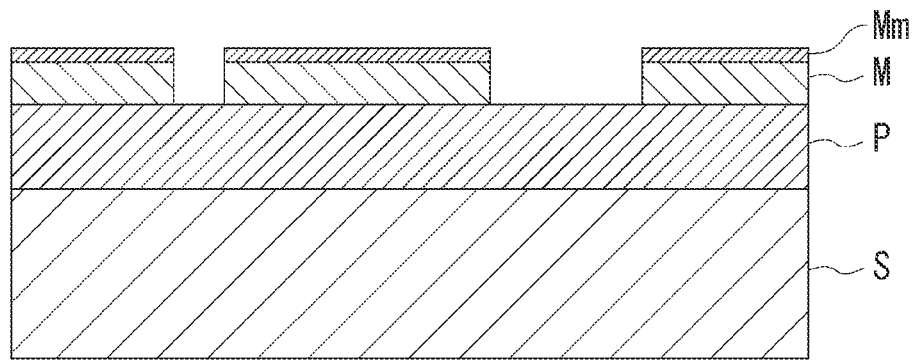
FIG. 26 is a cross-sectional view showing a step of the etching method according to the second embodiment of the invention.

FIG. 26 is a cross-sectional view showing a step of the etching method according to the embodiment.

In the resist protective film-forming step S17 shown in FIG. 24, as shown in FIG. 26, the resist protective film Mm is formed on the surface of the resist layer M by anisotropic plasma processing. Note that, the resist protective film-forming step S17 can be carried out in a processing chamber different from the processing chamber in which the dry-etching step S14 is to be carried out after the resist protective film-forming step S17.

The resist protective film Mm is a film capable of protecting the resist layer M from being etched in the dry-etching step S14.

In the plasma CVD method used in the resist protective film-forming step S17, a gas capable of forming $Si_xO_y\alpha_z$, for example, a mixed gas of $SiF_4$ and $O_2$, a mixed gas of $SiCl_4$ and $O_2$, a mixed gas of $O_2$ and $SiH_4$, TEOS, or the like is supplied to the chamber. Therefore, the plasma CVD method is carried out. Accordingly, it is possible to form the resist protective film Mm including a film configuration of SiOF on the resist layer M.

A SiOF film has a configuration similar to that of a $SiO_2$ film. Because of this, the thickness of the SiOF film does not decrease in the dry-etching step S14 to be carried out after the resist protective film-forming step S17.

The resist protective film Mm is formed on the surface of the resist layer M by the anisotropic plasma processing. The film thickness of the resist protective film Mm formed on the side wall of the opening pattern of the resist layer M is different from the film thickness of the resist protective film Mm formed on the surface of the resist layer M. Additionally, the film thickness of the resist protective film Mm formed on the bottom portion of the opening pattern of the resist layer M is different from the film thickness of the resist protective film Mm formed on the surface of the resist layer M. This is because the step coverage of the resist protective film Mm is small.

Also, in the resist protective film-forming step S17 according to the embodiment, in a similar way to the case of the resist protective film-forming step S07 of the first embodiment, the above-described plasma-processing apparatus 10 is used in order to carry out the plasma processing with high anisotropy.

Also, in the resist protective film-forming step S17 according to the embodiment, in a similar way to the case of the resist protective film-forming step S07 of the first embodiment, predetermined conditions are set.

For example, as conditions of the plasma CVD method, the same conditions as those of the first embodiment can be adopted.

Figure 27:
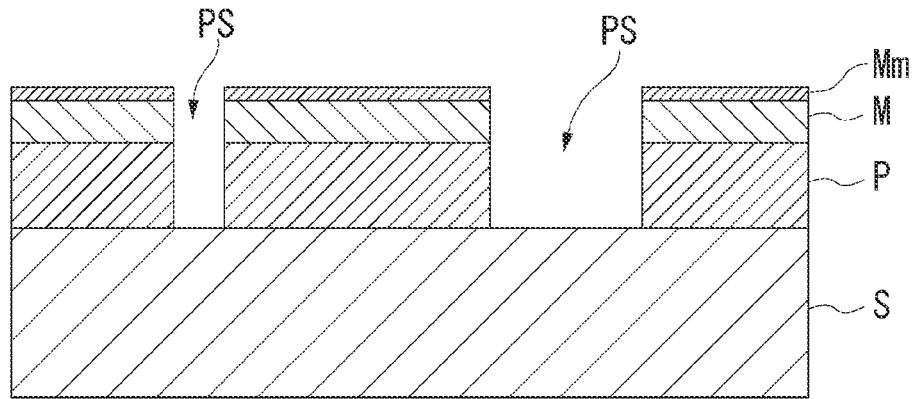
FIG. 27 is a cross-sectional view showing a step of the etching method according to the second embodiment of the invention.

FIG. 27 is a cross-sectional view showing a step of the etching method according to the embodiment.

In the dry-etching step S14 shown in FIG. 24, as shown in FIG. 27, the polyimide layer P corresponding to the opening pattern of the resist layer M is etched by the anisotropic plasma etching, and therefore, the recess pattern PS is formed.

As the etching conditions of the dry-etching step S14, kinds of gas, a flow rate of gas, a power, a pressure, a temperature, a distance from plasma, and a processing time can be adopted.

Furthermore, in the post-treatment step S18 shown in FIG. 24, if necessary, the resist protective film Mm is removed by a wet etching step or the same processing as that of the first embodiment. The resist layer M is removed by carrying out a wet etching step of processing similar to the dry-etching step S14, and therefore the etching method according to the embodiment is completed.

In the embodiment, the effects similar to those of the above-described embodiment can be obtained.

EXAMPLES

Hereinbelow, Examples according to the invention will be described.

Here, specific examples such as evaluation tests of the etching method according to the invention will be described.

Experimental Example 1

As described above, the recess patterns VS and VL were formed on the silicon substrate S using the plasma-processing apparatus 10 shown in FIG. 18 by the method according to the first embodiment. When the recess patterns VS and VL were formed, the resist layer M made of a resin and the resist protective film Mm were used.

Here, a via hole which serves as the recess pattern VS and has a diameter φS of 3 μm and a depth of 26 μm was formed. A via hole which serves as the recess pattern VL and has a diameter φL of 5 μm and a depth of 26 μm was formed. In this situation, the deposition step S03, the dry-etching step S04, and the ashing step S05 serve as one cycle, and this cycle was repetitively carried out fifty times. Furthermore, the resist protective film-forming step S07 was carried out every 10 cycles. In other words, the resist protective film-forming step S07 was inserted between the tenth cycle and eleventh cycle.

Deposition step S03: deposition step of forming a thin film including carbon

Dry-etching step S04: etching step of using the thin film including carbon as a mask and forming a TSV bottom portion of the insulating layer Ashing step S05: ashing step of removing the thin film including carbon Resist protective film-forming step S07: a step of forming a SiOF film (the resist protective film-forming step S07 was carried out after the tenth cycle was completed)

Post-treatment step S08: step of forming a through-hole electrode on a silicon substrate The conditions of forming the via hole were as follows.

In the plasma-processing apparatus 10 shown in FIG. 18, the diameter D (mm) of the first electrode 12 serving as the support part supporting the silicon substrate was fixed to 400 mm, and the diameter d (mm) of the second electrode (antenna AT2) was fixed to 400 mm.

Figure 28:
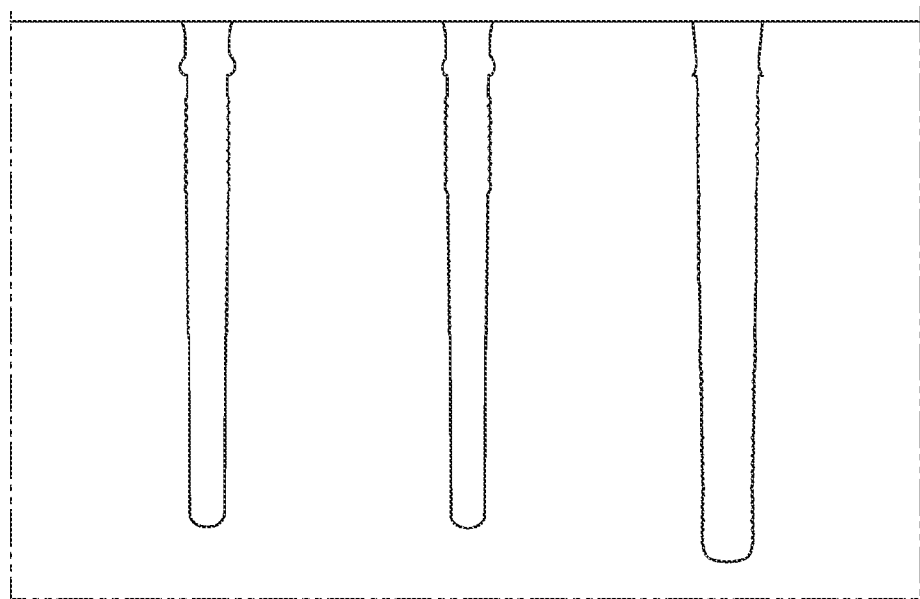
FIG. 28 is a cross-sectional view schematically showing a recess pattern obtained by an etching method according to Example of the invention.

The conditions of the deposition step S03 were as follows.
Supply gas: $C_4F_8$
Gas flow rate: $C_4F_8$ of 200 sccm
Processing ambient pressure: 9 Pa
Supply power of second electrode E2: 1500 W
Frequency $\lambda 2$ of supply power of second electrode E2: 13.56 MHz
Supply power of third electrode E3: 2000 W
Frequency $\lambda 3$ of supply power of third electrode E3: 2 MHz
Bias power: 0 W
Processing time: 14 sec The conditions of the dry-etching step S04 were as follows.
Supply gas: $SF_6$, $O_2$, $SiF_4$
Gas flow rate: $SF_6$ of 275 sccm, $O_2$ of 40 sccm, $SiF_4$ of 50 sccm
Processing ambient pressure: 9 Pa
Supply power of second electrode E2: 2000 W
Frequency $\lambda 2$ of supply power of second electrode E2: 13.56 MHz
Supply power of third electrode E3: 2000 W
Frequency $\lambda 3$ of supply power of third electrode E3: 2 MHz
Bias power: 100 to 200 W
Frequency $\lambda 1$ of bias power: 400 kHz
Processing time: 10 sec The conditions of the ashing step S05 were as follows.
Supply gas: $O_2$
Gas flow rate: $O_2$ of 450 sccm
Processing ambient pressure: 9 Pa
Supply power of second electrode E2: 2000 W
Frequency $\lambda 2$ of supply power of second electrode E2: 13.56 MHz
Supply power of third electrode E3: 2000 W
Frequency $\lambda 3$ of supply power of third electrode E3: 2 MHz
Bias power: 200 W
Frequency $\lambda 1$ of bias power: 400 kHz
Processing time: 20 sec
Material used to form resist layer: chemically amplified resist, PMER series photoresist material (produced by TOKYO OHKA KOGYO CO., LTD)
Film thickness of resist layer: 5 μm The conditions of the resist protective film-forming step S07 were as follows.
Carried out every 10 cycle
Supply gas: $O_2$, $SiF_4$
Gas flow rate: $O_2$ of 160 sccm, $SiF_4$ of 200 sccm
Processing ambient pressure: 9 Pa
Supply power of second electrode E2: 2000 W
Frequency $\lambda 2$ of supply power of second electrode E2: 13.56 MHz
Supply power of third electrode E3: 2000 W
Frequency $\lambda 3$ of supply power of third electrode E3: 2 MHz
Bias power: 0 W
Processing time: 10 sec FIG. 28 is a cross-sectional view schematically showing the recess patterns VS and VL formed under the aforementioned conditions.

Figure 29:
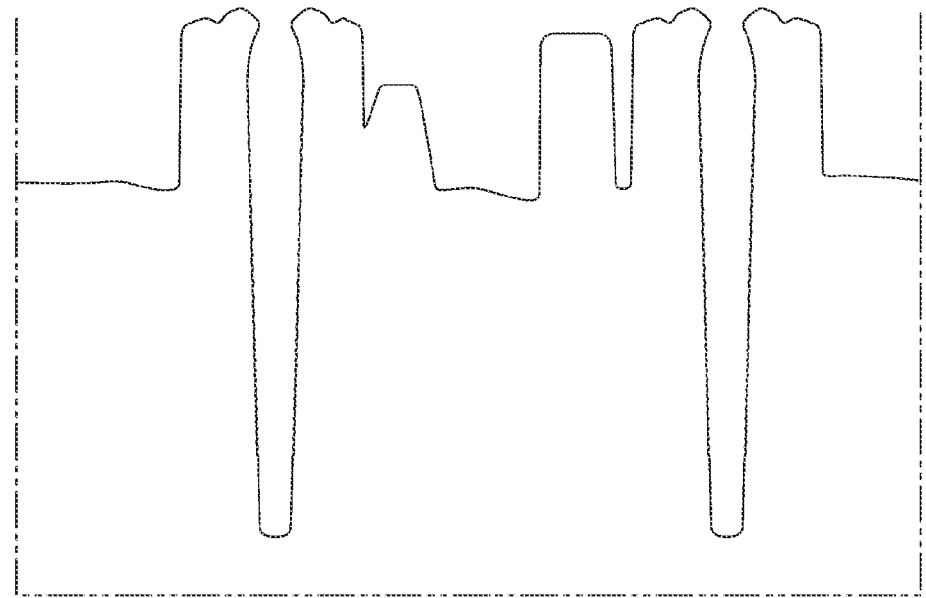
FIG. 29 is a cross-sectional view schematically showing a recess pattern obtained by an etching method according to the Comparative Example of the invention.

FIG. 29 is a cross-sectional view schematically showing a recess pattern obtained by an etching method according to the Comparative Example of the invention. In the Comparative Example, a recess pattern was formed without forming a SiOF film.

From the above-mentioned results, it is important to set the processing conditions as follows.

A silicon dry etching process method firstly carries out a resist pattern-forming step of forming a resist layer having a resist pattern. Next, the silicon dry etching process method repetitively carries out three steps in total of: carrying out a $C_xF_y$ deposition-step; carrying out an etching-step after the deposition-step; and carrying out a deposition-ashing step after the etching-step, and therefore causes the RIE-lag not to be generated. As a result of carrying out the resist pattern-forming step, it was possible to accurately carry out the silicon dry etching process method.

A silicon dry etching process method carries out a repetitive process including three steps in total of: carrying out a $C_xF_y$ deposition-step; carrying out an etching-step after the deposition-step; and carrying out a deposition-ashing step after the etching-step, and further including a SiOF-film forming process. The repetitive process and the SiOF-film forming process were carried out in the same processing chamber.

Consequently, since the silicon substrate is not transferred between the plurality of chambers, it is possible to reduce the amount of particles.

INDUSTRIAL APPLICABILITY

As application examples of the invention, the invention is applicable for protection of a device layer formed on a substrate, protection of a resist material not having resistance properties, or the like.

What is claimed is:

1. An etching method comprising:
   a resist pattern-forming step of forming a resist layer on a target object, the target object being made of silicon, the resist layer being formed of a resin, the resist layer having a resist pattern;
   a deposition step forming a deposition layer on the target object using a first gas in accordance with the resist pattern, the first gas containing fluorocarbon,
   an etching step of etching the target object via the resist layer having the resist pattern, the etching step being to be carried out after the deposition step,
   the etching step including a dry etching treatment carried out with respect to the target object using a second gas in accordance with the resist pattern;
   an ashing step to be carried out after the etching step, the ashing step using a third gas; and
   a resist protective film-forming step of forming a resist protective film on the resist layer, wherein
   the etching step is repetitively carried out multiple times,
   a processing gas used in the resist protective film-forming step, that includes a gas capable of forming $Si_xO_y\alpha_z$, wherein a is any one of F, Cl, H, and $C_kH_l$; and wherein each of x, y, z, k, and l is a selected non-zero value; and
   wherein after the etching steps are repetitively carried out multiple times, the resist protective film-forming step is performed.

2. The etching method according to claim 1, wherein the resist protective film-forming step uses a plasma film formation method.

3. The etching method according to claim 1, wherein in the resist protective film-forming step, the processing gas includes a mixed gas, and
   the mixed gas includes: oxygen gas; and at least one of $SiF_4$ gas, $SiCl_4$ gas, and $SiH_4$ gas.

4. The etching method according to claim 1, wherein the resist protective film-forming step is not carried out until an etching state of the target object obtained by the etching step becomes a predetermined state.

5. The etching method according to claim 4, wherein the resist protective film-forming step is carried out after a predetermined aspect ratio of the target object is obtained by the etching step.

6. The etching method according to claim 1, wherein:
   in the etching step, the second gas contains sulfur fluoride and silicon fluoride,
   in the ashing step, the third gas contains oxygen gas,
   in the ashing step, an anisotropic plasma processing is carried out, and the anisotropic plasma processing has anisotropy in a direction in which a recess pattern is formed on a surface of the target object,
   in the anisotropic plasma processing, inductively-coupled plasma is generated by applying an alternating voltage to an electrode disposed so as to face the target object, and
   a frequency of the alternating voltage applied to a position of the electrode corresponding to a center region of the surface of the target object is different from a frequency of the alternating voltage applied to a position of the electrode corresponding to an outer-periphery region of the surface of the target object.

7. The etching method according to claim 6, further comprising:
   preparing a plasma-processing apparatus comprising:
   a chamber including an upper lid, the upper lid having a center region and an outer-periphery region, the outer-periphery region being located outside the center region, the chamber being configured to carry out plasma processing with respect to the target object in an internal space capable of reducing a pressure thereof;
   a first electrode disposed in the chamber, the target object being mounted on the first electrode;
   a first power source configured to apply a bias voltage having a first frequency 21 to the first electrode;
   a spiral shaped second electrode disposed outside the chamber, the second electrode being located at an opposite side of the first electrode with respect to the upper lid, the second electrode being disposed on the center region;
   a spiral shaped third electrode disposed outside the chamber, the third electrode being located at an opposite side of the first electrode with respect to the upper lid, the third electrode being disposed at the outer-periphery region outside the second electrode;
   a second power source configured to apply an alternating voltage having a second frequency 22 to the second electrode;
   a third power source configured to apply an alternating voltage having a third frequency 23 to the third electrode;
   a gas introduction device configured to introduce a processing gas containing fluorine into an inside of the chamber; and
   a solid source located between the upper lid and the first electrode in the chamber, the solid source being disposed closer to the upper lid than the first electrode, the solid source being used in sputtering, wherein
   when the anisotropic plasma processing is carried out, when the second frequency $\lambda 2$ and the third frequency $\lambda 3$ are in relationship of $\lambda 2 > \lambda 3$,
   the gas introduction device is disposed at the center region of the upper lid.

* * * * *